US006876839B2

(12) United States Patent
Harris

(10) Patent No.: US 6,876,839 B2
(45) Date of Patent: Apr. 5, 2005

(54) INTERMEDIATE FREQUENCY PLANNING IN RADIO TRANSMITTERS AND RECEIVERS

(75) Inventor: Robert Michael Harris, Camberley (GB)

(73) Assignee: Matsushita Electric Industrial Co., Ltd., Osaka (JP)

( * ) Notice: Subject to any disclaimer, the term of this patent is extended or adjusted under 35 U.S.C. 154(b) by 438 days.

(21) Appl. No.: 10/072,941

(22) Filed: Feb. 12, 2002

(65) Prior Publication Data

US 2003/0032398 A1 Feb. 13, 2003

(30) Foreign Application Priority Data

Feb. 12, 2001 (GB) .............................. 0103384

(51) Int. Cl.[7] ................................................ H04B 1/38
(52) U.S. Cl. ........................ 455/141; 455/296; 455/147
(58) Field of Search .......................... 455/85–87, 73, 455/75–77, 91, 114.1, 114.2, 130, 141, 165.1, 147, 278.1, 208–209, 302, 316, 226.1, 255, 258, 296, 183.1, 183.2, 120

(56) References Cited

U.S. PATENT DOCUMENTS

| | | | | |
|---|---|---|---|---|
| 4,206,412 A | * | 6/1980 | Tsurumaru | ............... 455/307 |
| 5,564,097 A | * | 10/1996 | Swanke | ..................... 455/302 |
| 5,689,819 A | * | 11/1997 | Nishimura et al. | ........... 455/86 |
| 5,752,174 A | * | 5/1998 | Matai et al. | .............. 455/183.1 |
| 5,794,131 A | * | 8/1998 | Cairns | ......................... 455/76 |
| 6,567,654 B1 | * | 5/2003 | Coronel Arredondo et al. | ........................ 455/315 |
| 2003/0068995 A1 | * | 4/2003 | Louis et al. | ................ 455/313 |
| 2003/0193923 A1 | * | 10/2003 | Abdelgany et al. | ......... 370/342 |

FOREIGN PATENT DOCUMENTS

| | | | |
|---|---|---|---|
| DE | 2 250 877 | 6/1992 | |
| GB | 2 250 877 A | * 5/1992 | ............. H03J/5/00 |

* cited by examiner

Primary Examiner—Sonny Trinh
(74) Attorney, Agent, or Firm—McDermott, Will & Emery LLP

(57) ABSTRACT

A method of intermediate frequency (i.f.) planning for radio transmitters and receivers involves predicting which i.f. or i.f. range will result in spurious emissions to or response from one or more "avoidance bands" being sources of unwanted signals or frequency bands closed to transmission, whereby to choose an i.f. or i.f. band which minimises such i.f. bands. The method may be carried out by computer software which may be embedded in a transmitter/receiver having means for varying its i.f.

60 Claims, 12 Drawing Sheets

TxRx_planner kernel in Conventional supernet receiver

First Image Band

TxRx_planner kernel in Conventional supernet receiver

TxRx_planner in Block-conversion (DSP) Radio Receiver

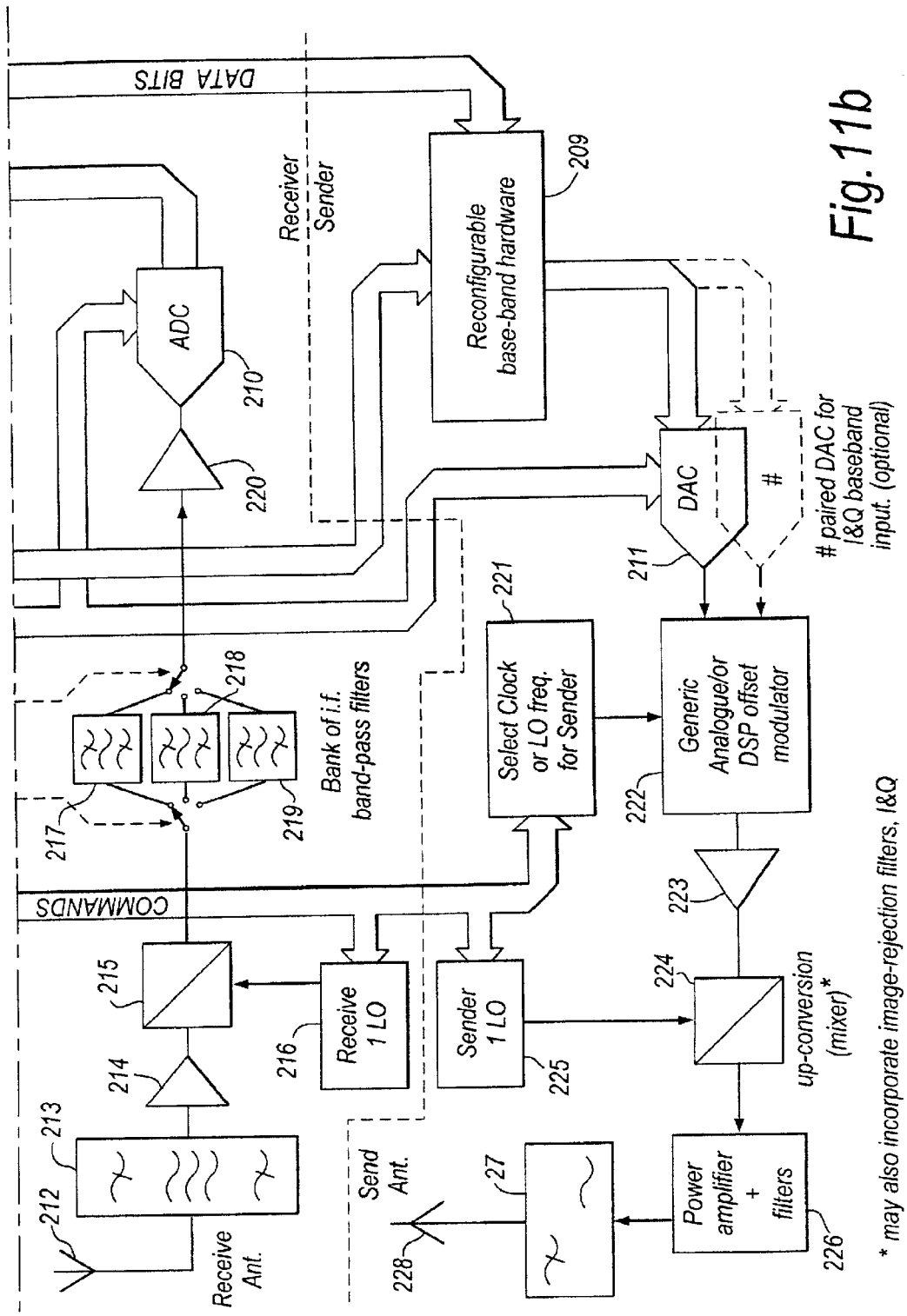

INTERMEDIATE FREQUENCY PLANNING IN RADIO TRANSMITTERS AND RECEIVERS

The present invention relates to a method of determining the frequency of operation of a local oscillator in a radio frequency transmitter or receiver. Examples of such transmitters and receivers include mobile telephones, commercial radio receivers and short wave radio transmitters and receivers used in military applications. The invention is particularly applicable to front-end frequency converters in both radio receiving and radio sending equipment, being either self-contained radios or the r.f. "front end" sub systems of other equipment.

The invention is also applicable to single or double (or more) super-heterodyne architectures, the conversion nearest to the final on-air frequency being of chief interest. In this case, the present invention is chiefly concerned with the intermediate frequency (i.f.) following (in a receiver) or preceding (in a transmitter) the final on-air radio frequency. This frequency is termed hereinafter the "the first intermediate frequency" or "first i.f.". The associated local oscillator is hereinafter referred to as the "first local oscillator" (1-LO).

Current radio frequency design centres on the sender and/or receiver outline specification of the tuning range and the (first) i.f. bandwidth which must be fixed from the outset. Starting from this specification, the first intermediate frequency is often chosen from a catalogue on the questionable basis of:

a) Tradition;
b) How it was done last time;
c) Least trouble with commercial suppliers;
d) Catalogue price (not necessarily the same as cost in volume production).

Then, after the radio's send and/or receive chain has been elaborated, the spurious (unwanted) emissions and responses are determined, e.g. first image response/emission, local oscillator leakage and i.f. susceptibility. If any of the spurious emissions grossly exceed the designer's electromagnetic compatibility (EMC) specification, then either the whole frequency plan has to be re-worked or, more likely, extra engineering effort and cost must be expended. That usually entails time consuming attempts to suppress the unwanted emissions in the case of a radio transmitter, or, in the case of a radio receiver, the addition of more protection against unwanted spurious responses. In both cases, extra components can become necessary increasing the component count and consequently the bill of materials.

Thus, it is desirable to provide a method of radio frequency design centering on users' specifications and the spectral EMC requirements of third parties. It would be preferable to provide a method in which the tuning range and i.f. bandwidths need not be fixed at the very start of the design phase but can be left open for a while.

The preferred embodiment of the invention is a PC based utility to expedite the choice of optimal first intermediate frequency for radio transmitters and receivers. By way of background, the operation of super-heterodyne radio receivers and senders will be briefly explained with reference to FIG. 1 which shows traditional block schematic designs for a super-heterodyne radio receiver (top) and sender (below). In a receiver 20 the incoming radio frequency signal is passed through a roofing filter 21 to receive the wanted signal at frequency f. The signal is amplified by amplifier 22 and then mixed in mixer 23 with a waveform provided by local oscillator 24 at frequency f+z, z being the intermediate frequency. Thus, the mixer 23 yields the sum and difference frequencies of the mixing process, i.e.

$f+(f+z)=2f+z$ and $f-(f+z)=z$.

The output signals from the local oscillator 24 are filtered by intermediate frequency bandpass filter 25 whereby the high frequency mixer products are excluded and only signals centred on frequency z are allowed to pass. The intermediate carrier frequency z is usually chosen to be lower than the radio carrier frequency f. In general it is easier to implement subsequent amplification, filtering, sampling etc. of a lower-frequency carrier than on a higher frequency carrier because, for example, lower frequency components are less expensive. However, there are certain applications in which the frequency z is higher than the radio frequency f. The frequency "z" is termed the intermediate frequency whether it is above or below f because it is an intermediate, rather than final, frequency.

In a transmitter 30 signals to be transmitted, e.g. audio signals are modulated in modulator 31 on to carrier frequency z and mixed in mixer 32 with signals at a frequency f+z from first local oscillator 33. Thus, mixer 32 yields sum and difference signals at frequencies $(f+z)-z=f$ and $(f+z)+z=f+2z$ which signals are filtered at filter 34 to yield only signals at frequency f to be amplified in amplifier 35, filtered in harmonic filter 36 and transmitted from transmitter 37.

The foregoing describes arrangements in which the local oscillator tunes above the wanted frequency f, hereinafter termed "hi-mix". In alternative receiver or transmitter arrangements the local oscillator may be tuned to a frequency below f, f−z, hereinafter termed "lo-mix".

Optimisation of the first i.f. entails all the associated frequency translation choices, such as the local oscillator tuning range, and whether it is a above (hi-mix) or below (low-mix) the band of wanted signals to which the receiver is to be tuned. The underlying assumption is that all of the major spurious emissions and responses can be removed from an externally imposed protective band by a prudent choice of mixing frequency plan. The invention is therefore a tool to aid internal frequency planning, enabling unlimited engineering solutions to external electromagnetic capability constraints.

In the following the terms "radio frequency transmitter" and "radio frequency receiver" are intended to encompass stand alone equipment as well as the receiving and/or transmitting ends of other equipment.

The conventional super-heterodyne principle is explained in more detail in FIG. 2. FIG. 2 consists of two graphs, (a) illustrating the lo-mix scheme and (b) illustrating the hi-mix scheme. The shaded areas illustrate the dispositions of typical spectra of radio signals. The rectangles represent the band of frequencies passed by the band pass filter.

By means of a set of quantitative modifications, a new architecture known as "block conversion" can be derived from the conventional super-heterodyne architecture. It is known to be in use for radio reception but may equally be employed for sending.

Furthermore, hybrid architecture is postulated, bearing resemblance to both the conventional super-heterodyne and block conversion principles.

The present invention is applicable to block conversion and hybrid architecture as well as the conventional super-heterodyne.

The derivation of block conversion is explained with reference to the conventional super-heterodyne receiver of FIG. 1 (top). The components 21, 22 and 23 up to and including the first mixer/frequency changer 23 remain as they are in a conventional implementation. The first local oscillator now remains at a constant frequency irrespective of the particular channel to which it is desired to tune the radio. All the channels in a designated (wide) band (of width B) are down converted in mixer 23 into a corresponding band of equal width B but lower absolute frequencies. Typically the band of lower frequencies occupies a range of +H to H+B, where H is an offset frequency, usually relatively small, achieved by arranging for the local oscillator 24 to be offset from either the top or bottom edge of the r.f. band by the amount H. This principle is explained more clearly in the graphs of FIG. 3 in which (a) illustrates a lo-mix scheme and (b) illustrates a hi-mix scheme. Here the much wider band pass filter is shown embracing an accordingly wide and complex radio signal—typically several channels. In the lo-mix arrangement the down converted spectrum is ordered in the same sense as it had on air. In the hi-mix arrangement the spectrum is reversed on conversion, highest becomes lowest etc.

The i.f. band pass filter of the conventional radio (item 25) is here replaced with a low pass filter, which transmits the wide band, of width B+H, to base-band circuits and an analogue to digital converter. Once the base-band complex of signals has been sampled and rendered in digital form, a high speed sequence of binary numbers, powerful digital signal processing (DSP) can take over. The DSP performs the task of resolving the complex spectrum into individual signals, selecting whichever is desired, and recovering its communicated information.

In some implementations, the first mixer is replaced by a digital sampling device, in which samples of the incoming waveform are taken at regular intervals, as determined by a sampling clock. As far as spurious emissions, and image responses are concerned, the digital sampler is analogous to the conventional mixer, and hence comes into the same analysis.

Despite those qualitative distinctions, block-conversion still resembles the conventional architecture in that it:

i. can receive a plurality of radio signals across predefined band (item 21);

ii. entails a mixing process, using a relatively strong 1LO, or sampling clock waveform;

iii. the frequency of the 1LO or sampling clock waveform is offset by a relatively small frequency difference from wanted signals;

iv. that offset can be varied in each particular design (whether strictly i.f. in the conventional architecture, or some parameter corresponding to 'H' in block conversion);

v. the 1LO or sampling clock waveform can be set above the block of wanted signals, or below, corresponding to the categories of "hi-mix" and lo-mix";

vi. for each particular choice of offset (whether strictly i.f. in the conventional architecture, or some parameter corresponding to 'H' to block conversion) there will be different sets of spurious responses, and different sets of spurious emissions to consider.

It will be appreciated that variations are possible between a conventional super heterodyne architecture on the one hand and full block conversion on the other, hereinafter referred to as hybrid architectures. A hybrid would allow the first local oscillator to be tuned whilst at the same time down converting a much wider band of frequencies than is ultimately required. An example of the operation of a hybrid architecture is illustrated in FIG. 4.

Since the wide pass band of the band pass filter of a block conversion or hybrid radio is equivalent to a range of intermediate frequencies in a conventional radio, the references to intermediate frequency should be considered hereinafter to apply equally to block conversion or hybrid devices.

In a first aspect, the present invention provides a method of determining an appropriate intermediate frequency or range of intermediate frequencies for a radio frequency (r.f.) receiver in which a received modulated r.f. signal is mixed with a signal from a local oscillator at a different frequency to yield as one of the mixing products a signal at a desired intermediate frequency for subsequent processing, the method comprising the steps of:

a) determining a tuning band of radio frequencies which the receiver is desired to receive;

b) determining an avoidance band containing radio frequencies closed to external transmission and/or frequencies of sources of outside interference;

c) identifying a plurality of spurious mechanisms by which the receiver either receives or transmits spurious signals and determining the frequencies of the spurious signals in relation to the intermediate frequency; and d) determining which intermediate frequencies result in spurious emissions to or responses from the avoidance band for any of the frequencies in the tuning band.

It follows from the foregoing that a similar method may be used to design a radio frequency transmitter. Annexed claim 8 describes such a method. Furthermore, the combined methods may be used to design a transceiver which may have different intermediate frequencies for transmission and reception or the same front-end intermediate frequency.

It is already known to provide radio receivers with means for shifting the local oscillator frequency whilst the receiver is in use to avoid spurious signals for the particular radio frequency to which the receiver is tuned. One example is shown in GB-A-2250877. By contrast, the present invention enables the prediction of spurious signals for the whole of the tuning range prior to the design of the transmitter or receiver whereby to avoid such spurious signals and avoid the need for adjustment of the local oscillator frequency each time a radio is re-tuned.

U.S. Pat. No. 5,752,174 discloses a radio selective calling receiver having first and second local oscillators switchable between "high mix" and "low mix" (explained in more detail below) to achieve a combination that does not result in interference between the two oscillators for the received call signal frequency. Here the intermediate frequency itself is unchanged, and again the alteration of local oscillator configuration is done in response to a particular call frequency. No attempt is suggested to design out such interference by considering the whole of the tuning range when selecting the intermediate frequency.

U.S. Pat. No. 5,689,819 discloses a transmitter-receiver circuit designed to mitigate interference between the transmitting and receiving sides. Only one spurious mechanism is taken into account, namely the well-known first image. Furthermore there is no suggestion in this disclosure of determining a range of unsuitable intermediate frequencies for a tuning range rather than for a particular frequency to which the radio is tuned.

In contrast to the known methods described above, in the method according to the invention the frequencies of spurious emissions are predicted and the receiver/transmitter i.f.

or local oscillator frequency (or frequency range for hybrid/ block conversion) can then be positively selected to avoid spurious emissions in the avoidance band. In the prior art, the tendency has been towards providing extra hardware to remove spurious responses instead of managing the design such that undesirable spurious responses do not appear in the first place.

Ideally the intermediate or local oscillator frequency should be chosen to avoid all unwanted (i.e. in the avoidance band) emissions or responses but this is not always possible. It may be that there are no available l.o. or i.f. frequencies which avoid all unwanted emissions or responses. In such a situation one possibility would be to simply pick an i.f. which eliminates as many of the spurious mechanisms as possible. This assumes that the spurious mechanisms are equally significant. Alternatively, in the preferred method the spurious mechanisms are ranked, for example according to their effect on the performance of the receiver/transmitter. Then, if it is not possible to choose an intermediate frequency (i.f.) which avoids all spurious responses from or emissions to the avoidance band, an i.f. may be chosen, for example, that causes only the least significant spurious mechanism.

In the preferred embodiment of the invention, for each spurious mechanism one or more ranges of intermediate frequency are determined, which do not result in emissions or responses in the avoidance band for the whole of the tuned band. The range or ranges derived for each mechanism are then superimposed, in a layered methodology, in the hope that there is at least one range of available intermediate frequency which does not result in unwanted emissions or responses. If this is not the case, the least significant of the spurious mechanisms can be eliminated, and if necessary this step repeated until an available range is found. The range of intermediate frequencies may be determined by means of a computer program. The program could operate automatically according to a predetermined ranking order or the order could be determined by an operator making suitable judgements as the design process proceeds.

A computer program product according to the invention could be an embedded object in a larger design program including also factors such as cost of components, number of components etc. The speed of operation of the design process resulting from it being incorporated in a computer program renders this a practical design tool for iterative optimisation processes.

In a particularly advantageous embodiment of the invention, the spurious mechanisms are ranked according to their significance and a range of available intermediate frequencies is divided into sub ranges identified by the most significant spurious mechanism, if any, resulting from the use of an intermediate frequency in that sub range. Then, if there is no "ideal" range, the appropriate range is the one resulting in the least significant spurious response(s).

In the preferred method of the invention, for receiver or transmitter, one or more hazard bands are determined for each spurious mechanism, being ranges of frequency or spurious emissions or responses each corresponding to the whole of the tuning band. The available ranges of i.f. can then be determined by ensuring that the hazard bands do not overlap the avoidance band, for example using mathematical inversion of formulae defining the hazard bands.

The hazard bands and hence the range of available intermediate frequencies may be determined by suitable computer software. Such software may be embedded in a radio receiver so that it is able to adjust its local oscillator/ intermediate frequency according to prevailing conditions, for example a move from one country to another where the avoidance band is different. A transmitter/receiver would need means for receiving information that the avoidance band has changed. This could be pre-progranmued with avoidance band data for a certain number of countries in which it was likely to be used, so that the operator would simply have to enter a country code for the transmitter/ receiver to re-tune itself to a suitable i.f. for that country. Alternatively a receiver might have means for receiving broadcast data relating to a change in avoidance band and responding to that data by re-tuning if necessary. In some applications, e.g.: military, the transmitter/receiver might have means enabling a user to input avoidance band data. Claim 35 describes a radio receiver according to the invention.

In the proposed modification of the invention, for use with block-conversion architectures, an arbitrary choice of "i.f." is determined by choosing the exact middle component of the band of wanted signals. The other signals are then considered to be wide-band extensions of the central signals, i.e. the sideband, having an extent of $\pm B/2$. The new parameter, $B/2$, enters explicitly into a modified set of formulae, creating a species of "guard band" around the imposed "Avoidance bands". With that minor difference, the wide-band versions of the formulae are very close to their counterparts in the narrow-band version. Likewise, the hybrid case can be accommodated by an extra parameter, "b", the width of the wide band filter, where b is less than B.

A preferred method according to the invention for a conventional super-heterodyne transmitter or receiver will now be described by way of example only and with reference to the accompanying drawings in which:

FIG. 1 comprises two block schematic diagrams showing the main components of a radio frequency receiver (top) and transmitter (below)

The method to be described below is particularly designed to screen out eleven spurious mechanisms which may cause unwanted emissions, reception of unwanted signals or both. The method is intended for the design of transmitters and receivers and therefore deals with some spurious mechanisms which effect only a transmitter or only a receiver. The relative importance of spurious mechanisms may vary according to the intended application for the transmitter or receiver. Thus, the ranking of the spurious mechanisms in terms of importance is a task for the operator. A typical ranking is shown in the table below.

TABLE 1

Typical Ranking and Attribution of Spurious Mechanisms

| TASK | Rank | Mnemonic | Spurious mechanism | Tx→ | Rx→ | Rx← |
|------|------|----------|--------------------|-----|-----|-----|
| B | 1 | IMG | ordinary image (first i.f.) | ✓ | | ✓ |
| C | 2 | LO1 | local oscillator leakage | ✓ | ✓ | |
| D | 3 | IFL | first i.f. leakage | ✓ | ✓ | |
| E | 4 | S2A | second image - closer | | | ✓ |
| F | 5 | S2B | second image - further | | | ✓ |
| G | 6 | S3A | third image - closer | | | ✓ |
| H | 7 | S3B | third image - further | | | ✓ |
| J | 8 | LA2 | second harmonic of 1 LO as affecting the avoidance band only | ✓ | ✓ | |
| K | 9 | LT2 | second harmonic of 1 LO as affecting the tuned band only | ✓ | ✓ | |
| U | 10 | SUM | mixer sum product | | | ✓ |
| L | 11 | IMP | third-order reverse inter-modulation product of 1 LO and ANY strong in-band carrier | ✓ | | ✓ |

Tx→ — means spurious, unwanted emissions from radio transmitter;
Rx→ — means spurious, unwanted emission from radio receiver;
Rx← — means spurious, unwanted response of receiver to outside interference.

The method starts from the assumption that there is a single band of available frequencies for the radio frequency signal (the tuned band) and a single band of frequencies termed the "avoidance band" which are either closed to radio frequency transmission or create a real source of r.f. energy which might interfere with the performance of the product being designed. Not only must the frequency f be outside the avoidance band but it is also necessary to ensure that any spurious emissions from receivers and transmitters are outside the avoidance band.

Figure 2A:
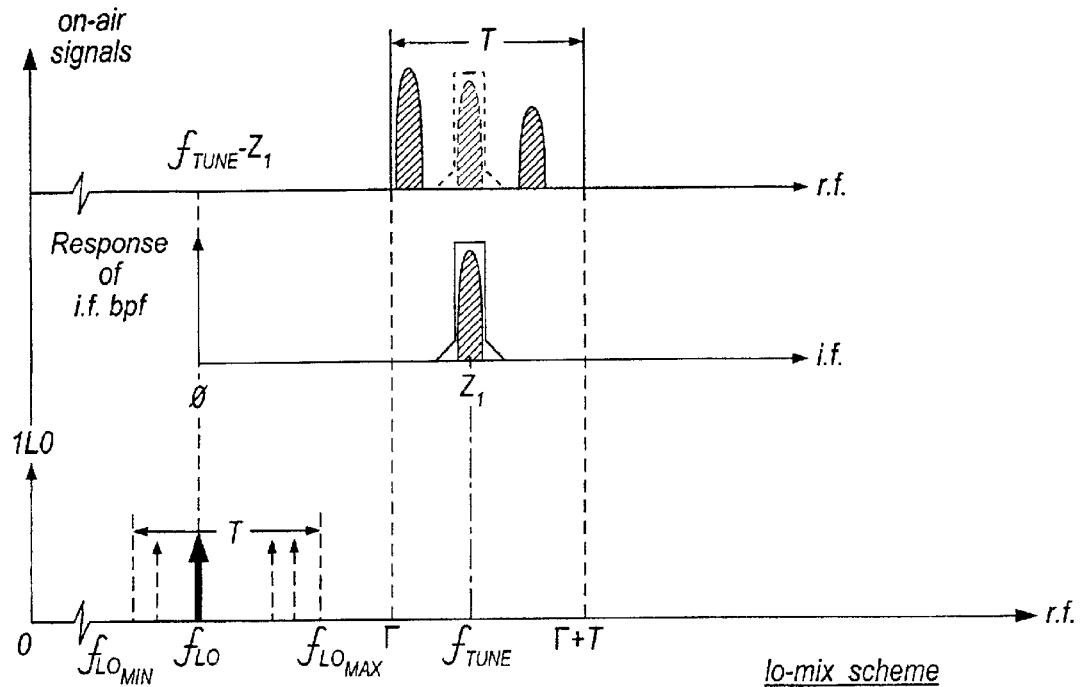
FIG. 2 shows two graphs illustrating the conventional super-heterodyne principle with (a) indicating the lo-mix scheme and (b) indicating the hi-mix scheme.
Figure 2B:
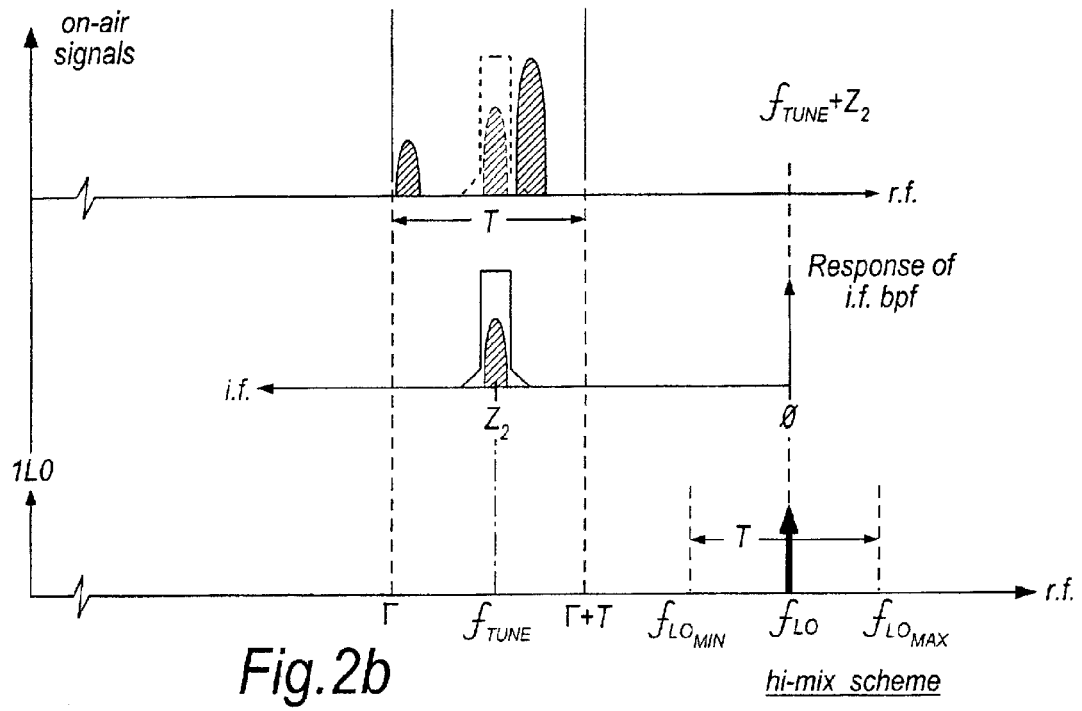

The method requires a minimum of input data, best understood by reference to FIG. 2. FIG. 2(a) illustrates the situation in which the band of available values for f is above the avoidance band and FIG. 2(b) illustrates the situation in which the band of available f is below the avoidance band. The graphs of FIG. 2 can be regarded as templates, hereinafter referred to as emc templates.

In FIG. 2 W represents the distance (in terms of frequency) from the bottom of one band to the bottom of the other, B is the band width of the avoidance band, T is the width of the tuned band. The additional variable Γ represents the lowest (absolute) frequency to which the transmitter/receiver can be tuned Each of the eleven distinct spurious-generating mechanisms is a consequence of a multiplicative, or otherwise non-linear electronic process in the time domain. For each elemental spectral requirement, i.e. at the lowest level of decomposition, there are two options in any super-heterodyne radio system. One is to make the local oscillator tune above the target (on-air) radio frequency, the other is to tune it below, termed "Hi-mix", and "Lo-mix" respectively. That makes for 22 possible formulations but there is another consideration.

In order to avoid the potentially messy use of negative quantities, two different sets of algebraic expressions have been formulated to differentiate between avoidance bands above, and below the radio's tuning range.

On top of that, an allowance has been made for the two alternative mixer architectures that primarily govern the radio's susceptibility to spurious responses and emissions. Thus, for each spurious-generating mechanism, there can be up to four different sets of formula, called strategies, which are listed in the Table below

TABLE 2

Definition of Strategies

| avoidance band | hi-mix | lo-mix |
|----------------|--------|--------|
| above | a | c |
| below | b | d |

Each of the two alternative spectral templates shown in FIG. 2 can be met with a choice of two mixer strategies.

The causes of spurious emissions and responses in transmitters and receivers will be briefly explained below.

Images

Figure 1:
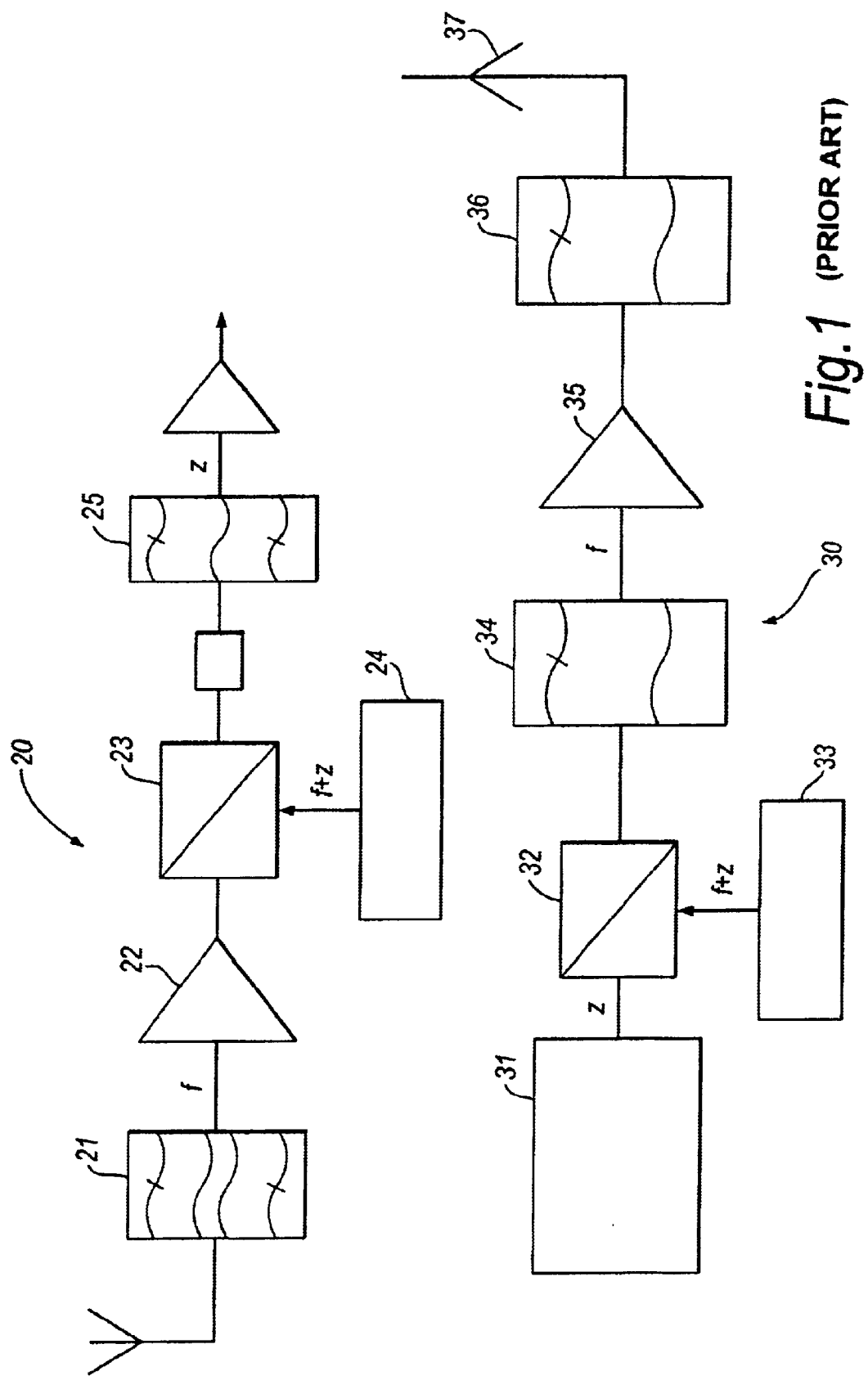

In electronic mixers, such as items 23 and 32 in FIG. 1, frequency changing is achieved using the electronic equivalent of multiplying two time-domain periodic waveforms, usually sinusoids. Most usefully one is the wanted signal, e.g. a sinusoid with arbitrary amplitude 'a', and the other is always a pure sinusoid with fixed amplitude, 'b' thus:

wanted signal, at frequency $\omega_1$: signal(t) = a.cos($\omega_1$t)
pure sinusoid, at frequency $\omega_2$: stimulus(t) = b.cos($\omega_2$t)  where t is time.

The output of the frequency changer is the multiplicative product:

signal(t)Xstimulus(t)=
½a.b[cos($\omega_1$−$\omega_2$).t+cos($\omega_1$+$\omega_2$).t]   Equation 1

The product contains terms representing the sum and differences of the two contributing signals. At a radio receiver, it is the difference signal that is required.

The receiver's i.f. band-pass filter is centred on the difference frequency, z=|($\omega_1$−$\omega_2$)|, so transmitting only the signal component, ½ a.b. cos($\omega_1$−$\omega_2$).t The band-pass filter is conventionally fixed, so to tune in the wanted signal at $\omega_1$ the frequency, $\omega_2$, of the stimulus is altered, thus:

tuned frequency=$\omega_2$±z   Equation 2

The "±z" is involved because ($\omega_1$−$\omega_2$) may be positive or negative, i.e. $\omega_1$ may be above or below $\omega_2$. So the frequency of the stimulus, actually the "local oscillator", is given by:

$\omega_2$=$\omega_1$±z   Equation 3

Note that, in general, there are two frequencies that satisfy Equation 3; they are always equally disposed about the frequency of the local oscillator, and are termed "images" of one another.

An Example

Another, much more practical, way of performing the frequency changing in a radio receiver, is to replace the local oscillator sinusoid with a square wave at the same frequency. It may be stated that the corresponding mixer product will contain not only the sum and difference terms as before but also an infinite series of unwanted sinusoids of amplitudes decreasing with increasing frequency. The square wave itself can be represented as a sum to infinity of the sequence:

Square($\omega_2 t$)=$b$. cos($\omega_2 t$)+
$b$/3. cos(3 $\omega_2 t$)+$b$/5. cos(5$\omega_2 t$)+ . . .  Equation 4

The mixer output=$b.a(t)$[cos($\omega_2-\omega_1$).$t$+1;3 cos(3$\omega_2-$
$\omega_1$).$t$+1;5 cos(5$\omega_2-\omega_1$).$t$+ . . . ]

+$b.a(t)$[cos($\omega_2+\omega_1$).$t$+1;3 cos(3$\omega_2+\omega_1$).$t$+

⅕ cos(5$\omega_2+\omega_1$).$t$+ . . . ] Equation 5

Assume a "hi-mix" option, so that $\omega_1 < \omega_2$ and the wanted i.f. is z=$\omega_2-\omega_1$. The wanted i.f. (z) is passed through the succeeding band-pass filters that reject very strongly at all other frequencies. Depending on how good the filters are, only an arbitrarily small, negligible amount of the higher-order terms is ever passed. However, should another external signal exist at frequency $\omega_3$ then there could arise a situation where, for the same value of local oscillator (tuning the radio to receive frequency $\omega_1$), one of the higher-order terms converts the unwanted signal into the i.f. pass band, thus:

(3$\omega_2-\omega_3$)=z=($\omega_2-\omega_1$)

Hence $\omega'_3$=2.z+3.$\omega_1$ Equation 6

If a "lo-mix" architecture had been chosen instead, $\omega''_3$=3.$\omega_1$−4.z Equation 7

The above result is typical of the moderately complicated dependence of the spurious responses on the choice of mixer architecture.

Bandwidth Considerations

Modulation

Up to now, the wanted r.f. and the translated i.f. have been treated as pure sinusoids, or spectral lines of definite frequency and zero bandwidth. For the electrical disturbance to warrant the term "signal" it must carry some information, usually in the form of modulation. On a much longer time scale than the period of the sinusoid amplitude (or small frequency) variations may be superimposed; in signal(t) the constant multiplier 'a' can then be considered to be varying with time, so that a=a(t). If stimulus(t) is generated by the local oscillator, then its multiplier, 'b', is kept constant so that the amplitude of the product is given by:

detector output=b.a(t)

a(t)=(detector output)/b—which is exactly what the user of the radio wants.

An important consequence of the modulation is the spectral broadening of the otherwise pure sinusoid. Without modulation all the energy is concentrated (mathematically) at definite frequency; with modulation the energy is distributed over a small range of frequencies, giving rise a concept of bandwidth. The relative broadening is so slight that for many purposes the r.f. and i.f. signals may still be thought of as sinusoidal waveforms at a single frequency.

Selectivity

In addition to mapping the wanted off-air radio signal down to a convenient i.f. for amplification, selectivity implies the rejection of unwanted r.f. interference on other frequencies. Having determined (usually by international convention) a division of the radio spectrum into channels of definite bandwidth, off-air signals can be assessed as being either in-channel or else in adjacent channels with respect to the tuning of the receiver. That conception reflects the greater difficulty in rejecting radio energy that is at frequencies closest to the wanted frequency.

The receiver ideally accepts all the energy in the tuned channel and rejects all the energy in all the channels on either side of it. The receiver's selectivity, is normally determined by a high-performance band-pass filter, centred on the i.f. Only a narrow band of frequencies around the i.f. can be transmitted through the receiver and amplified. At increasing frequency offsets from z, e.g. z±y, the i.f. filter attenuates the spectral components until a large enough rejection obtains at y=Y, let us say.

The i.f. filter's band-pass profile is effectively transferred to the outside world, in as much as frequencies around the wanted carrier frequency, f, are similarly attenuated. The receiver becomes less and less sensitive to other radio transmissions in, for example, adjacent channels, at offsets of ±Y. The defence against interference breaking through is largely determined by the selectivity filter, or a cascade of such filters.

Other Non-linear Effects

There are four essential opportunities for non-linear distortion:

the off-air r.f. signal before being down converted in the frequency changer;

the distortion of the local oscillator;

distortion of the i.f. signal in or just before its passage through the tuned amplifier;

amplification of the demodulated (base-band) wanted signal.

The second has been addressed already, and the last is of no consequence to optimising the choice of i.f. The first and third are now addressed in reverse order.

Distortion in the Pass Band

The down-converted signal at i.f. will suffer harmonic distortion, since it will be the only strong signal present. All the distortion products will conform to second, third and so on harmonics, at 2z, 3z, 4z, 5z . . . In the normal situation, the fundamental, z, will be transmitted and amplified whilst the harmonics will be attenuated by the band-pass filter(s). For the same tuning of the local oscillator, there will, in general, be a (spurious) external radio frequency, f(½) that gets down converted to z/2. The radio is deemed not to be tuned to f(½) because z/2 will not be passed by the i.f. stages of the receiver. However, if second harmonic distortion is present, a derived component will be at 2×(z/2)=z, and that will be amplified. The receiver will thereby have a spurious response to f(½), known as the "second image". A new string of spurious responses using that mechanism arises in response to each significant harmonic of the i.f.

Front-end Distortion

The bandwidth of the r.f front end is, in general, wide enough to catch many signals, wanted and unwanted. Any non-linear response from front-end amplifiers (including those outside the "radio" as an entity, such as antenna amplifiers) and even the first mixer will involve multiple signals. Three types of distortion or non-linear processing need to be distinguished:

when the wanted signal is strong and dominant, there will harmonic distortion, as described ABOVE when there is an additional stronger, unwanted signal present, it may cause de-sensitisation of the amplifier, and so modulate the amplitude of the wanted signal;

when two unwanted carriers are present, some of the products of their inter-modulation distortion may lie inside the pass band of the front end.

The first can be rationalised out of existence; any harmonic distortion of the input will give rise to new frequencies, which may be treated as a virtual "unwanted" signals, indistinguishable from truly independent unwanted r.f. interference. It merely multiplies the probability that any arbitrary interfering carrier should hit a known spurious response of the receiver; it doesn't add any new responses.

The second can cause annoyance, or even loss of reception but does not add to the list of spurious responses.

The last can operate in the absence of the wanted signal, or it can totally overwhelm a weak wanted signal. The most commonly encountered manifestation is third-order inter-modulation distortion.

Two-tone, Third-order Inter-modulation Distortion

The prerequisite for third-order inter-modulation distortion is a non-linear transfer characteristic of the polynomial form:

$$\text{Output}(t) = A \cdot x(t) + B \cdot x^3(t) \quad \text{Equation 8}$$

where x(t) is the input linear variable (current, electrical potential)

Coefficient 'A' represents a wanted gain factor, and B represents the potency for third-order inter-modulation distortion. Any non-linear terms in $x^2(t)$ have no effect but terms in $x^4(t)$, $x^5(t)$, etc. do.

For information, a corresponding fifth-order inter-modulation distortion takes off from polynomials with terms in $x^5(t)$ and higher. The results from the following third-order analysis may be extrapolated to fifth and so on.

Consider the (linear) addition of two sinusoidal carrier waveforms, of equal amplitude for clarity:

$$\text{Excitation}, x(t) = \cos(f_1 t) + \cos(f_2 t) \text{ where } f_2 > f_1$$

$$\text{Output} = A \cdot [\cos(f_1 t) + \cos(f_2 t)] + B \cdot [(\cos(f_1 t) + \cos(f_2 t))^3] \quad \text{Equation 9}$$

The component of the output corresponding to the 'A' terms in Equation 9 is just a magnified copy of x(t):

Corresponding to the 'B' term, will be a mass of trigonometrical terms, including cosines and sines of new frequencies, the $3^{rd}$-order inter-modulation products (i.m.p.):

$$F_1 = 2f_1 + f_2$$

$$F_2 = 2f_1 - f_2$$

$$F_3 = f_1 + 2f_2$$

$$F_4 = |f_1 - 2f_2|$$

The frequencies $F_1$ and $F_3$ being very large usually fall well out of harm's way. The other two, $F_2$ and $F_4$, cluster around the original frequencies $f_1$ and $f_2$, offset by $(f_2 - f_1)$ above and below them, thus:

$$\text{upper i.m.p. } F_2 = f_2 + |(f_2 - f_1)| \quad \text{Equation 10}$$

$$\text{lower i.m.p. } F_4 = f_1 - |(f_2 - f_1)| \quad \text{Equation 11}$$

That means that if $(f_2 - f_1)$ is relatively small, then the i.m.p. will probably also fall within the same pass band; ergo, they cannot be filtered out as easily as nominally "out-of-band" interfering signals. Hence, i.m.p. tend to be troublesome to radio. The fifth-order counterpart i.m.p. are removed by twice as much from the generating tones, and so are slightly less of a problem from a frequency point of view. In addition, the efficiency with which fifth-order i.m.p. can be generated is much reduced compared to third-order.

The only i.m.p that can be generated in the i.f. amplifier must be derived from tones that are themselves close to the wanted if. Hence, the effect is merely to broaden out the selectivity of the receiver. Much more serious is the effect of i.m.d at the front end and in the mixer. With much less restriction on input frequencies, it possible to have a joint range tone pairs that create a $F_2$ or $F_4$ that falls exactly on the i.f. Note that in this case the condition of the local oscillator is irrelevant; the susceptibility is independent of the receiver tuning. Unlike many of the other spurious mechanisms, the receiver has a joint spurious tone-pair response, a continuum of frequencies that can flood the receiver. Against this almost irremediable vulnerability is the statistical improbability of the two tones possessing the critical mutual relationship.

Correspondence Between Sender and Receiver

The chief difference between the sender and receiver is that whilst they both possess spurious emissions, only the receiver is defined to have spurious responses. (NB receivers also emit energy at very low levels).

Some of the mathematical relationships investigated above in respect of radio receivers also govern the spurious emission of radio senders. If the sender uses a super-heterodyne architecture, then the frequency changer can also produce similar high-order mixer products as in Equation 5. The most ideal multiplicative mixer still produces an image, being the unused product in Equation 1. So-called image-rejection mixers suppress the unwanted side band (first image) but that is at best incomplete and its existence must still be noted.

Both sender and receiver may leak some of the powerful local oscillator drive, and to a lesser extent, the i.f. signal. Often strongly clipped in the mixer circuit, the local oscillator signal is rich in harmonics and they too can leak to the outside world as spurious emissions.

According to the invention, for each spurious mechanism, one or more hazard bands is determined, being ranges of frequency of spurious emissions or responses corresponding to the tuned band. The following section explains how the hazard bands are determined.

The 11 Spurious Mechanisms

General Note

Figure 5:
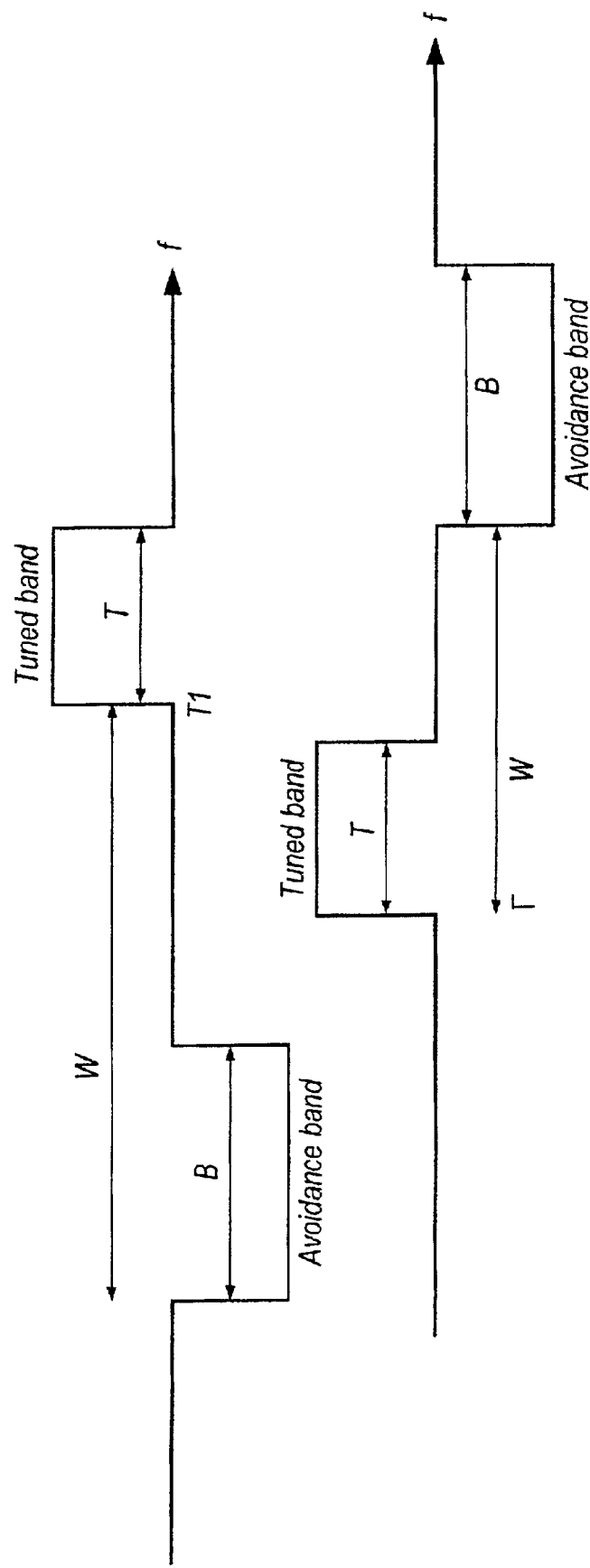
FIG. 5 is a graph showing the relationship between the tuned band and a possible avoidance band for the purpose of explaining the parameters used in the method.

The full list of spurious-generating mechanisms is given above. Each mechanism has a three-character mnemonic, a short title, designation as an emission or a response. Each is attributed to sender, receiver or both. The governing equations are derived for each mechanism in the following sub section. Reference is made to the key variables used in the description of FIG. 5.

The formulae are derived separately for each of the two mixer architectures, hi-mix and lo-mix, corresponding to strategies a and b, and c and d respectively.

Some mechanisms share a common theory and have been grouped together for analysis, e.g. the "closer" and "further" second images. However, every one of the eleven mechanisms, has its own third-level sub-section containing the compact formulation.

For each canonical mechanism, the interim results will be presented in tabular form, for consistency.

TABLE 3

Paradigm for Interim Results

| Strategy | Conditional expression | Impact | Hazard band from (lower edge) | to (upper edge) |
|---|---|---|---|---|
| A | no conditions | above | $2\Gamma + z$ | $2\Gamma + 2T + z$ |
| B | no conditions | above | $2\Gamma + z$ | $2\Gamma + 2T + z$ |
| c & d | if $\{\Gamma > T2\}$ else | BOTH | $2\Gamma - z$ n/a | $2\Gamma + 2T - z$ n/a |

In most cases, the "Conditional expression" is superfluous but there are some formulations where a logical test determines either the validity of the expression to its r.h.s., or decides between alternative expressions. In such instances, the tidiest way to encapsulate the total formulation is in the form of:

if {logical expression} . . . [formula 1] else . . . [formula 2/validity disclaimer]

A brief inspection of the formula for the hazard band shows whether the impact of the spurious is above or below the tuned band (or both).

1. First Image (IMG)

Theory

This is the only one of the eleven that is both a receiver response and a sender emission. It is helpful to consider first the action in a sender with a super-heterodyne architecture, such as a typical short-wave (HF) transceiver. The signal modulation is applied to the r.f. carrier by various electronic operations on a much higher i.f., which is lowered to the wanted r.f. before being amplified and sent to the antenna, etc.

The down conversion may be performed by mixing the i.f. signal with the local oscillator waveform. Careful engineering approximates to the situation represented by Equation 3, where two images are generated. Re-writing Equation 3:

$$f = \omega_2 \pm z \qquad \text{Equation 12}$$

where f is the wanted radio frequency to go out on air, and $\omega_2$ is the tuned frequency of the local oscillator (1 LO). The minus sign indicates the case of interest here, so we may write, unambiguously:

$$\omega_2 = f + z \qquad \text{Equation 13}$$

Substituting Equation 13 back into Equation 12, the two image frequencies turn out to be:

the required on-air radio frequency, $$(f+z) - z = f$$

the unwanted "first image" of frequency, $$(f+z) + z = f + 2z \qquad \text{Equation 14}$$

Furthermore, as the frequency of the 1 LO is varied to make the transmitted signal tune over other wanted frequencies, the first-image output also moves about hazarding other users of the r.f. spectrum.

Figure 6:
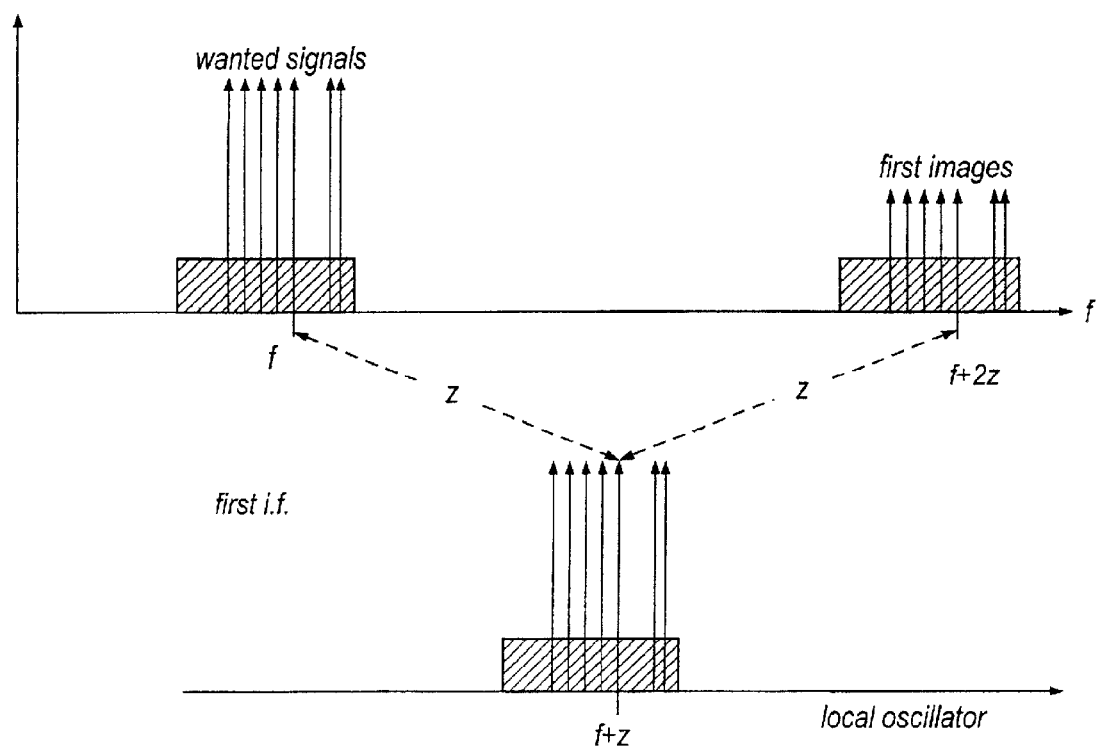
FIG. 6 is a graph showing the relationship between the local oscillator frequency and the first image bands.

The image frequency can be suppressed by a number of means but never entirely eliminated. Corresponding to the band of wanted frequencies or channels to which the sender may be tuned, is an image band, see FIG. 6. Unintended r.f. energy can be emitted anywhere in this band depending on where the sender is tuned.

In Reception

In the case of this first-image phenomenon, the disposition of the frequencies involved remains unchanged when "receiver" is substituted for "sender"; only the energy flow is reversed. The wanted frequency, f, now becomes the centre of the channel to which the receiver is tuned, and the first image, f+2z, a spurious channel to which the receiver can also respond, simultaneously, as follows.

Hence, any incoming third-party transmissions at f+2z represent an unguarded source of interference, which will be translated into the receiver's first i.f. Mixing the wanted signal (at frequency f) with 1 LO at (f+z) produces: z, and 2f+z, whereas mixing the unwanted image frequency, f+2z with the 1 LO produces z, and 2f+3z. Hence the detected i.f. is determined by the energy content of both the wanted signal and the unwanted interference in the "first image" channel.

The engineering investment behind the filter-based selectivity is completely circumvented by the first-image mechanism. It is almost as if the receiver were tuning in to another, spurious, frequency in the normal way, and, indeed, the receiver is precisely as selective about this image response as it is about the normal channel.

Figure 3A:
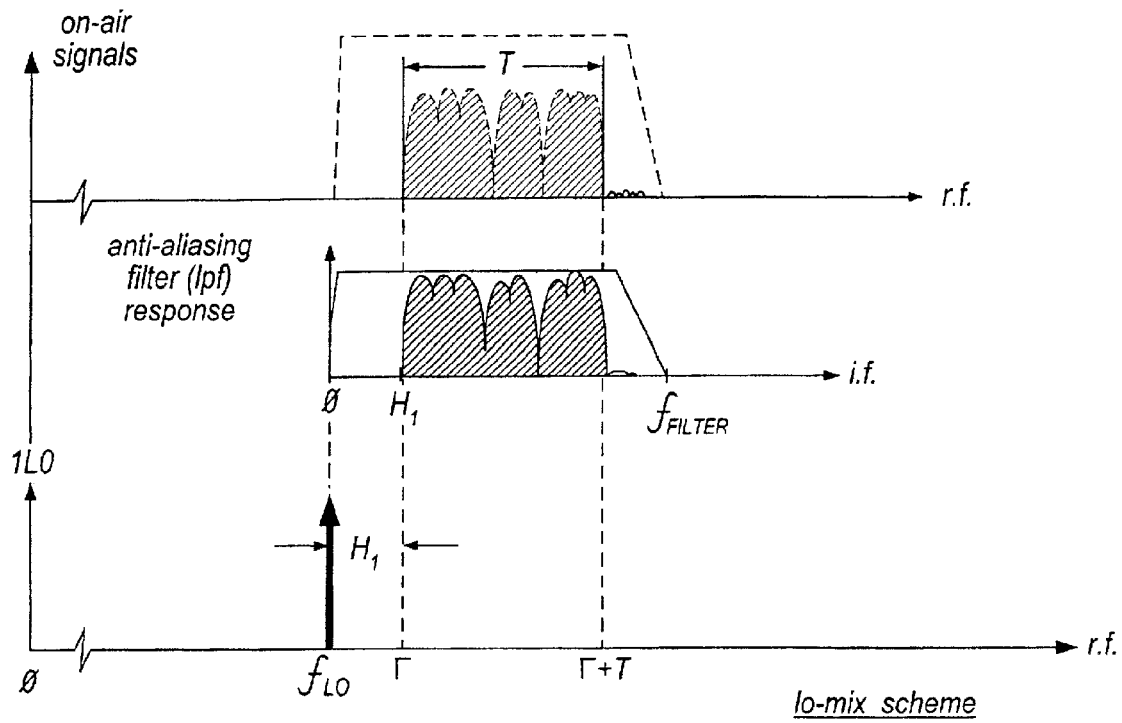
FIG. 3 shows graphs corresponding to FIG. 2 for the block conversion principle.
Figure 3B:
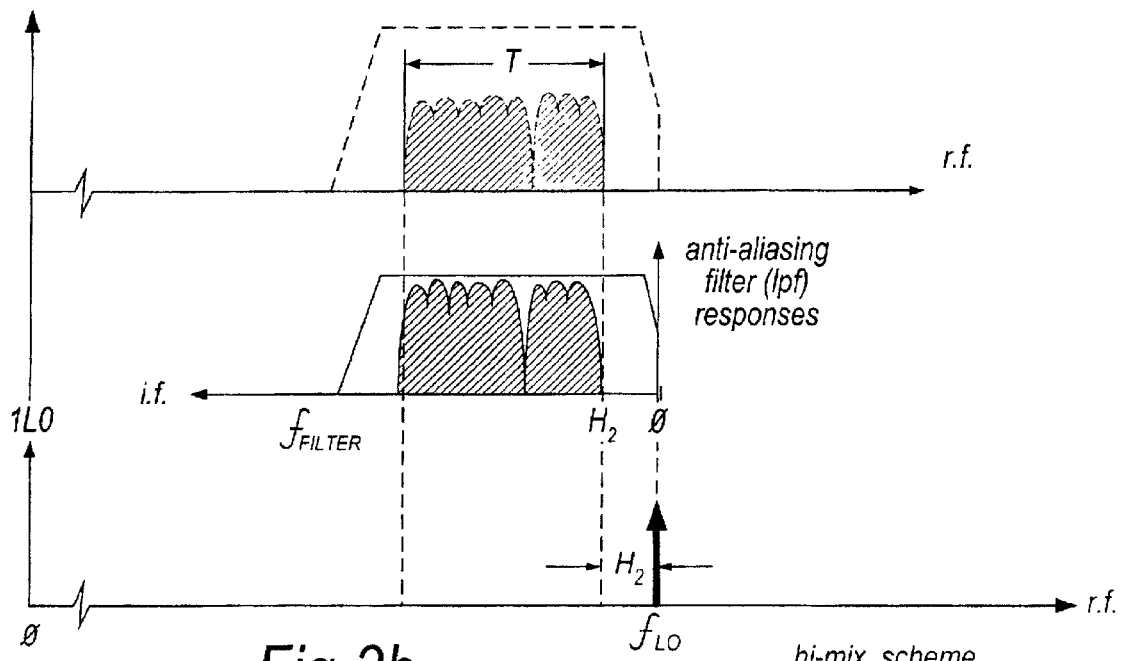
Figure 4:
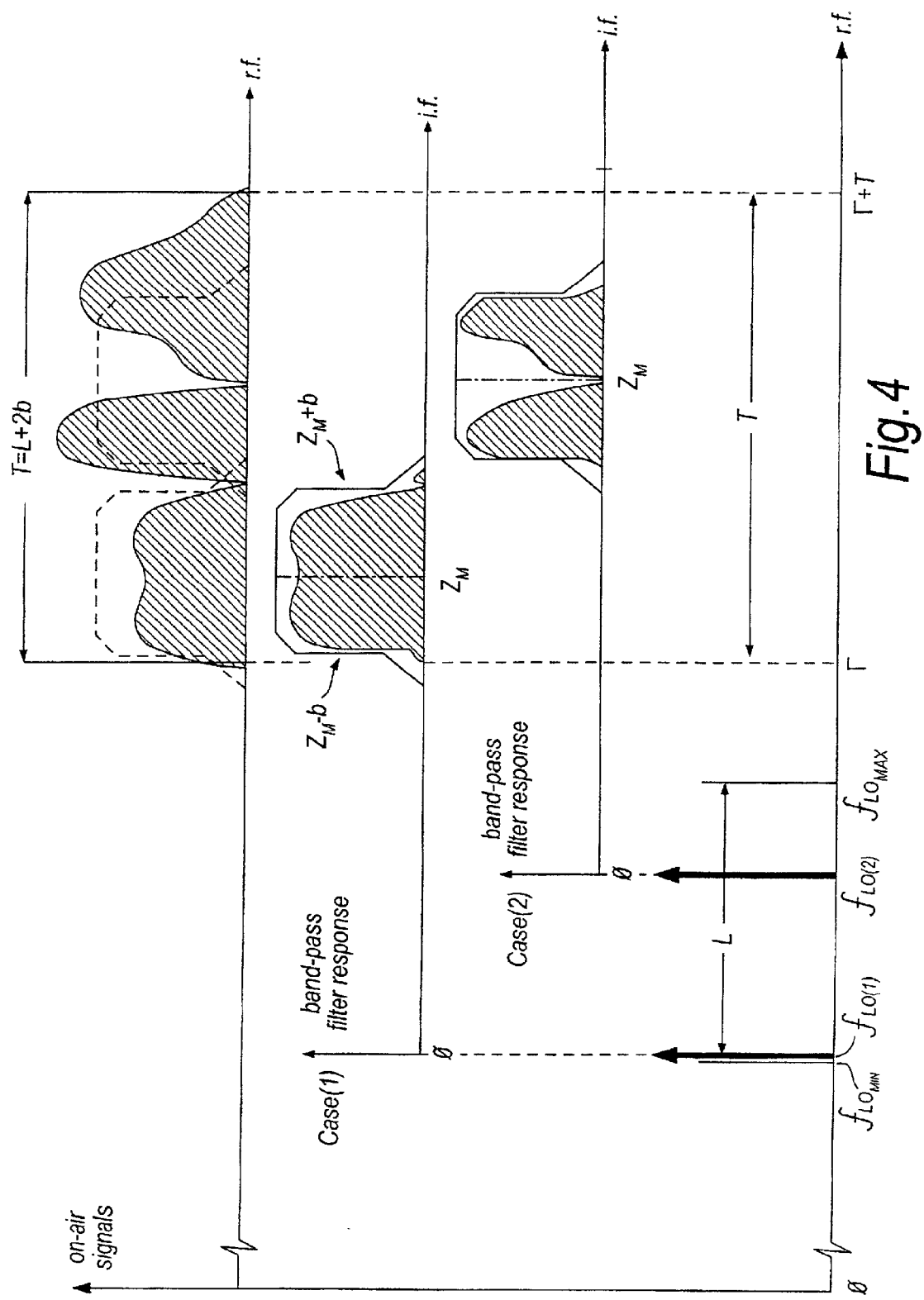
FIG. 4 shows graphs corresponding to FIG. 2 for a hybrid architecture, lo mix only.

Corresponding to the wanted band over which the receiver may be tuned, is an image band, see FIG. 3. As the receiver is tuned over its designated channels so it will also be susceptible to stray r.f. energy in the image band.

In both send and receive, the troublesome first images can be mitigated by interposing an extra wide band-pass passive filter (a roofing filter) between the antenna and the mixer. It serves to pass the band of wanted radio frequencies but attenuates heavily in the image band. Such a filter is often subject to engineering-cost compromises because it is more expensive to implement than the selectivity filter, having a wider pass band, and often being at a much higher frequency Formulation Hi-mix: Strategies a and b FIG. 6 precisely illustrates this situation, expressing Equation 14 for the sender example. As the radio frequency, f, tunes from $\Gamma$ to $\Gamma+T$, the image travels in the same direction from $\Gamma+2z$ to $\Gamma+T+2z$ Corollary 1 Hazard Band=$\Gamma+2z$ to $\Gamma+T+2z$ Lo-mix: Strategies c and d In the section entitled "Images", Equation 3 expressed the possibility of the local oscillator tuning below the wanted r.f. i.e. in contrast to FIG. 6. So by analogy:

$$\omega_2 = f - z \qquad \text{Equation 15}$$

Because the images are always equally disposed about the local oscillator the spurious first image is given by:

$f(\text{image}) = \omega_2 - |z|$ since the other image is the wanted, $f = \omega_2 + |z|$ Hence:

$$f(\text{image}) = (f - z) - z = f - 2z \qquad \text{Equation 16}$$

As the radio frequency tunes from $\Gamma$ to $\Gamma+T$, the first image travels in the same direction from $\Gamma-2z$ to $\Gamma+T-2z$ Corollary 2 hazard band=$\Gamma-2z$ to $\Gamma+T-2z$

TABLE 4

Interim formulation, IMG

| strategy | Conditional expression | Impact | Hazard band from (lower edge) | to (upper edge) |
|---|---|---|---|---|
| a | no conditions | above | $\Gamma + 2z$ | $\Gamma + T + 2z$ |
| b | no conditions | above | $\Gamma + 2z$ | $\Gamma + T + 2z$ |
| c | no conditions | below | $\Gamma - 2z$ | $\Gamma + T - 2z$ |
| d | no conditions | below | $\Gamma - 2z$ | $\Gamma + T - 2z$ |

2. Local Oscillator Leakage (LO1)

Theory

This is a spurious emission mechanism, which can apply to both senders and receivers. The local oscillator is either above (hi-mix) or below (lo-mix) the tuned channel of the radio. Thus:

| hi-mix: | $\omega_2 = f + z$ |
|---|---|
| lo-mix: | $\omega_2 = f - z$ |

Formulation

As the radio tunes across its range, from $\Gamma$ to $\Gamma + T$, so the 1 LO travels in the same direction from:

| Hi-mix: strategies a and b | $\Gamma + z$ to $\Gamma + T + z$ |
|---|---|
| Lo-mix: strategies c and d | $\Gamma - z$ to $\Gamma + T - z$ |

Hence Table 5:

TABLE 5

Interim formulation, LO1

| strategy | Conditional expression | Impact | Hazard band from (lower edge) | to (upper edge) |
|---|---|---|---|---|
| a & b | no conditions | above | $\Gamma + z$ | $\Gamma + T + z$ |
| c & d | no conditions | below | $\Gamma - z$ | $\Gamma + T - z$ |

This mechanism practically dominates the choice of i.f. and must always be included in any design run. The IMG mechanism allows values of z down to T/2, where the first image will just come inside the tuned band. However, for T/2<z<T, permissible for IMG, the LO1 mechanism would tune the 1 LO inside the tuned band, quite unacceptably.

The assumption of restricting the i.f. such that z>T will be used to simplify some of the later mechanisms.

3. First I.F. Leakage (IFL)

Theory

This is a spot-frequency spurious receiver response only. It is quite independent of any other considerations, expressing the fact that the i.f. tuned amplifier is always vulnerable to r.f. carriers impinging on the radio at the precise same frequency.

Formulation

Regardless of which strategy is employed, the hazard band is just z (plus its proper bandwidth, b/w). It is reasonable to assume that, for a super-heterodyne radio architecture, the i.f. is chosen to be below the tuned r.f.

TABLE 6

Interim formulation, IFL

| strategy | Conditional expression | Impact | Hazard band from (lower edge) | to (upper edge) |
|---|---|---|---|---|
| a, b, c, & d | no conditions | below | z (less half i.f. b/w) | z (plus half i.f. b/w) |
| a, b, c, & d | Special conditions* | above* | | |

*Rare exceptions can be cited, e.g. certain high-performance short-wave radio senders use a high i.f. in order to achieve wider tuning range from the 1 LO.

Second Images

Theory

This is a receiver spurious response to a radio frequency that has been down-converted to half the i.f., z/2. The second harmonic (see above under "distortion in the pass band") of the half i.f. tone is exactly equal to the i.f. and can be passed as a legitimate signal. For a particular tuning of the receiver, there are always two r.f. carriers that can generate the half i.f.

For either a hi-mix or lo-mix architecture, both the tones: $\omega_2 \pm z/2$ produce a term at z/2 at the output of the mixer. The r.f. tones are at f+z/2, and f+3z/2. A convenient distinction can be made (useful later on) between "closer" and "further" second images.

For a hi-mix architecture, the local oscillator ($\omega_2 = f+z$) is always above the wanted r.f., and so the image at f+z/2 lies midway between them, and is termed the "closer" of the two. By contrast, the image at f+3z/2 lies "further" away from the tuned r.f.

For a lo-mix architecture the spectral disposition is a mirror image. The closer image is now at f−z/2 and the further image is at f−3z/2. The four expressions for the second image have been re-grouped under "closer" and "further" mechanisms, as follows.

4. Second Image—Close (S2A)

The formulation for the hazard band is given in Table 7.

TABLE 7

Interim formulation, S2A

| strategy | Conditional expression | Impact | Hazard band from (lower edge) | to (upper edge) |
|---|---|---|---|---|
| a & b | no conditions | above | $\Gamma + z/2$ | $\Gamma + T + z/2$ |
| c & d | no conditions | below | $\Gamma - z/2$ | $\Gamma + T - z/2$ |

5. Second Image—Further (S2B)

The formulation for the hazard band is given in Table 8.

TABLE 8

Interim formulation, S2B

| strategy | Conditional expression | Impact | Hazard band from (lower edge) | to (upper edge) |
|---|---|---|---|---|
| a & b | no conditions | above | $\Gamma + 3z/2$ | $\Gamma + T + 3z/2$ |
| c & d | no conditions | below | $\Gamma - 3z/2$ | $\Gamma + T - 3z/2$ |

Third Images

Theory

As in the case of the second images, so the third harmonic of a down-converted spurious carrier can fall into the i.f.

pass band. The down-converted tone is at z/3, so the r.f. tones are at: $\omega_2 \pm z/3$, that is:

f±2z/3 for the closer images, and
f±4z/3 for the further images.

6. Third Image—Closer (S3A)

The formulation for the hazard band is given in Table 9.

TABLE 9

Interim formulation, S3A

| strategy | Conditional expression | Impact | Hazard band from (lower edge) | to (upper edge) |
|---|---|---|---|---|
| a & b | no conditions | above | $\Gamma + 2z/3$ | $T + 2z/3$ |
| c & d | no conditions | below | $\Gamma - 2z/3$ | $\Gamma + T - 2z/3$ |

7. Third Image—Further (S3B)

The formulation for the hazard band is given in Table 10.

TABLE 10

Interim formulation, S3B

| strategy | Conditional expression | Impact | Hazard band from (lower edge) | to (upper edge) |
|---|---|---|---|---|
| a & b | no conditions | above | $\Gamma + 4z/3$ | $\Gamma + T + 4z/3$ |
| c & d | no conditions | below | $\Gamma - 4z/3$ | $\Gamma + T - 4z/3$ |

General Multiple Images

For the $m^{th}$ images, where m=1, 2, 3 . . . (viz including the conventional first image) the general formula is:

| closer images: | $f \pm (m - 1)z/m$ |
|---|---|
| further images: | $f \pm (m + 1)z/m$ |

For m=1, the two closer image expressions coalesce into the wanted tone at f, whilst the further images at f±z concur with the derivation in the "First Image" section above.

The attribution of the images follows the similar pattern established for the second and third images.

8,9. Second Harmonic of 1 LO (LA2 & LT2)

Theory

This is really a simple spurious emission concerning radio receivers and senders, but the application to the spectral EMC template is actually quite complex. Ergo, the actual process has been divided artificially into two ostensible "mechanisms" for ease of coding. It turns out that the separate application of these two "layered" mechanisms, LA2 and LT2, fairly straightforward by themselves, accomplishes the equivalent of a very complex algorithm, and one that would prove hard to verify.

One of the accepted constraints of the super-heterodyne architecture is that the tuning range may not exceed the value of the first i.f. That keeps the local oscillator always above (hi-mix) or below (lo-mix) the receiver's tuning band, and enables any local oscillator leakage to be attenuated by the receiver's front-end "roofing" filter. It leads to an implicit requirement:

$z \geq T$  Equation 17

For the hi-mix architecture, the local oscillator itself and its second harmonic are necessarily above the tuned band of the receiver (or sender) and the harmonic can interact only with the designated "avoidance" band (to be treated in below). That simpler case gives rise to the "avoidance band only" qualification of the LA2 mechanism, see Table 1.

For the lo-mix architecture, the local oscillator is always below the tuned band, $\Gamma$ to $\Gamma+T$, as constrained by Equation 17. However, the second harmonic (as also any higher harmonics) may fall into the tuned band under certain numerical conditions.

To keep things simple, a new "mechanism", LT2, is coined that ignores the designated avoidance band of the EMC template, addressing only the tuned band, $\Gamma$ to $\Gamma+T$. Clearly, both mechanisms must be applied in all cases to clear the possibility of:

interference to other users of the tuned band, including self interference if the receiver is tuned to the second harmonic of its own local oscillator;

interference to other users of the avoidance band.

It is the successive application that effects the power of this method; successive elimination in effect implements the complex logical manipulations that would otherwise have required elaborate and obscure coding.

Formulation (Both LA2 and LT2)

TABLE 11

Interim formulation, LA2 and LT2

| strategy | Conditional expression | Impact | Hazard band from (lower edge) | to (upper edge) |
|---|---|---|---|---|
| a & b | no conditions | above | $2\Gamma + 2z$ | $2\Gamma + 2T + 2z$ |
| c & d | no conditions | BOTH | $2\Gamma - 2z$ | $2\Gamma + 2T - 2z$ |

10. Mixer Sum Product (SUM)

Theory

This is a spurious emission that, in practice, concerns receivers only. In Equation 1 the second term was ignored as not being of practical use for frequency changing in receivers. Whilst, therefore, unwanted it is none the less present and can be leaked back to the antenna. At the mixer it will have approximately the same strength as the wanted i.f., so if a strong signal is received, then a comparatively strong unwanted SUM tone may overcome the reverse-path attenuation and filter attenuation to be re-radiated.

A numerically corresponding mixer product in the super-heterodyne sender has already been addressed; in the framework of up-converting an i.f. to r.f. for emission, that component was designated a first image, see above. The receiver SUM product is distinct in frequency and origin from the receiver's first image.

When the receiver is tuned to a wanted r.f.=f, then the local oscillator will be at:

| hi-mix: | f + z |
|---|---|
| lo-mix: | f − z |

The corresponding SUM terms are:

| hi-mix: | 2f + z |
|---|---|
| lo-mix: | 2f − z |

The lo-mix case the SUM could fall in the tuned band if the local oscillator goes sufficiently low. For practical radio designs, that problem can be eliminated by simply insisting, from the start, that:

$$\omega_2(min) \geq T$$

Therefore, the lowest SUM product that can arise is:

$$\omega_2(min)+f(min)=(>T)+\Gamma \qquad \text{Equation 18}$$

which is just above the top of the tuned band. Now, invoking Equation 17, simultaneously, $$z \geq T$$

Equation 18 can be re-written:

$$[f(min)-z]+f(min)=(>T)+\Gamma$$

$$\Gamma z+\Gamma=(>T)+\Gamma \qquad \text{Equation 19}$$

From Equation 17, make the substitution, z>T in Equation 19:

$$\Gamma>2T \qquad \text{Equation 20}$$

Equation 20 is actually a prerequisite for the feasibility of the lo-mix architecture. Another condition is implicit in Equation 19, $$z<\Gamma-T \qquad \text{Equation 21}$$

and again invoking Equation 17, the pre-condition on z becomes:

$$T<z<\Gamma-T \qquad \text{Equation 22}$$

Equation 22 actually subsumes Equations 20 and 21.

Formulation

As the radio tunes across its range, from $\Gamma$ to $\Gamma+T$, so the mixer SUM emission travels in the same direction across the following-Hazard bands:

TABLE 12

Interim formulation, SUM

| strategy | Conditional expression | Impact | Hazard band from (lower edge) | to (upper edge) |
|---|---|---|---|---|
| a & b | no conditions | above | $2\Gamma + z$ | $2\Gamma + 2T + z$ |
| c & d | if ($\Gamma > 2T$) else: | BOTH | $2\Gamma - z$ invalid - not applicable | $2\Gamma + 2T - z$ |

Note that Equation 22 imposes a pre-condition on the spectral requirements of the radio itself:

T<z<$\Gamma$-T which leads to a valid range of i.f. to choose from only if $\Gamma$>2T.

11. Third-Order Reverse Inter-modulation Product Involving the 1 LO (IMP)

Theory

This is a special kind of spurious emission from either a receiver or from a sender. It is to be distinguished from the more commonly reported plain "reverse intermods" problem of broad-band transmitter power amplifiers. In that case, two strong, external, unwanted radio carriers impinge on the non-linear output circuits of the amplifier and generate i.m.p. The product, according to Equation 9, can easily fall within the bandwidth of the amplifier, or the antenna filters, and be re-radiated.

The subject mechanism here, requires only one external carrier of sufficient strength to produce inter-modulation distortion in conjunction with the already strong local oscillator tone. If the interfering carrier is not a standard image of the wanted carrier, then neither it nor the i.m.p. can be passed through the i.f. stages of the receiver. However, the re-radiated i.m.p., (or reverse i.m.p.) constitutes an important spurious emission, one that is addressed by the present method.

Since it does not require the simultaneous presence of two strong r.f. carriers, it will certainly occur whenever the target radio comes close to, or is approached by source of r.f. in the same radio band. The frequency of the reverse i.m.p. is determined by the tuning of the local oscillator, which in turn depends on the wanted tuned frequency, via the i.f., z.

In general, straddling the tuned band, are an asymmetrical pair of hazard bands in which the i.m.p. may occur. If the external interferer is effective only when it is within the radio's tuned band, then the bounds on both contributors to the i.m.p. are known. The resulting hazard bands are then three times the width of the radio's tuning band. They separate from the tuned band as z increases but at different rates; for every MHz increase in z, one travels 1 MHz, whilst the other travels 2 MHz in the opposite direction.

Within each architecture (hi-mix, lo-mix) the spectral EMC template will be concerned with only one of the i.m.p. hazard bands, hence the ensuing analysis is related to the application "strategy" as follows:

| | |
|---|---|
| Strategy (a) hi-mix | focus on upper hazard band; |
| Strategy (b) hi-mix | focus on lower hazard band; |
| Strategy (c) lo-mix | focus on upper hazard band; |
| Strategy (d) lo-mix | focus on lower hazard band. |

In Strategies (b) and (c) the possibility of self interference arises for normally acceptable ranges of z, i.e. z>T. In order to escape it an extended condition is z>2T.

Common Frame for Analysis

It is convenient to define a new frame whose origin is at the lower edge of the tuned band, $f_0=\Gamma$. Let the frequency of the wanted r.f. channel be $f_R=\Gamma+x$, and that of the strong interferer be $f_2=\Gamma+y$. The inter-modulation takes place between the strong interferer at $f_2$ and the 1 LO (at $f_1$) corresponding to $f_R$. The i.f. becomes a parameter to the formulation, since $f_1=f_R\pm z$.

Substituting in Equations 10 and 11 for the upper, and lower i.m.p. respectively, for $f_2>f_1$:

$$\text{Upper i.m.p. } F_2=f_2+|(f_2-f_1)|=\Gamma+y+|((\Gamma+y)-(\Gamma+x\pm z))| \quad \text{Equation 23}$$

$$\text{Lower i.m.p. } F_4=f_1-|(f_2-f_1)|=\Gamma+x\pm z-|((\Gamma+y)-(\Gamma+x\pm z))| \quad \text{Equation 24}$$

Adapting Equations 10 and 11 for the upper, and lower i.m.p. respectively, for $f_2<f_1$:

$$\text{Upper i.m.p. } F_2=f_1+|(f_1-f_2)|=\Gamma+x\pm z+|((\Gamma+x\pm z)-(\Gamma+y))| \quad \text{Equation 25}$$

$$\text{Lower i.m.p. } F_4=f_2-|(f_1-f_2)|=\Gamma+y-|((\Gamma+x\pm z)-(\Gamma+y))| \quad \text{Equation 26}$$

For each equation, the hazard band is determined by finding the lower and upper bounds of $F_2$ (Strategies (a) and (c)), and $F_4$=(Strategies (b) and (d)).

In order to avoid difficulties with signs of algebraic quantities, etc. the inequalities appropriate to each Strategy are addressed as special cases.

IMP Strategy (a)

The hi-mix choice dictates that $f_1=f_R+z$., hence $f_1>f_2$ for valid bounds of x, and y and the normal requirement that z>T. Equation 25 then becomes:

$$F_2=\Gamma+x+z+|(\Gamma+x+z-(\Gamma+y)|=\Gamma+|(2x+2z-y)|$$

The modulus, $|(2x+2z-y)|$, is always equal to the positive expression, $2x+2z-y$, because z>0 so $$F_2=\Gamma+2x+2z-y$$

The upper edge of the resulting hazard band, $F_{2(MAX)}$, is manifested when the radio is tuned to the top of its range (x=T) and the interferer is at the lower edge (y=0). Hence, $F_{2(MAX)}=\Gamma+2T+2z$ The lower edge of the hazard band, $F_{2(MIN)}$, is manifested when the radio is tuned to the bottom of its range (x=0) and the interferer is at the upper edge (y=T). Hence, $F_{2(MIN)}=\Gamma+2z-T$ The lower edge just touches the top of the tuned band, implying a degree of self-protection, provided (advisory) z>T. There are no other pre-conditions (save for the implicit z>T condition).

IMP Strategy (b)

Equation 26 is applicable for the below-band i.m.p., using the same hi-mix substitution as for Strategy (a):

$$F_4=f_2-|(f_1-f_2)|=\Gamma+y-|((\Gamma+x+z)-(\Gamma+y))|=\Gamma+y-|(x-y+z)|$$

The assumption is made that the LO1 mechanism rules out any cases where z<T for a sensible super-heterodyne architecture, so the contents of the modulus, (x−y+z), must always be positive. The modulus operator can now be removed, keeping the implied positive sign.

$$F_4=\Gamma+2y-x-z$$

The lower edge of the resulting hazard band, $F_{4(MIN)}$, is manifested when the radio is tuned to the top of its range (x=T) and the interferer is at the lower edge (y=0). Hence, $F_{4(MIN)}=\Gamma-(T+z)$ The upper edge of the hazard band, $F_{4(MAX)}$, is manifested when the radio is tuned to the bottom of its range (x=0) and the interferer is at the upper edge (y=T). Hence, $F_{4(MAX)}=\Gamma+2T-z$ As z is brought down to the value 2T, parametrically, so the upper edge of the hazard band approaches and then touches the bottom of the tuned band. In the normally permissible range t<z<2T, the hazard band actually overlaps the tuned band, implying that the IMP mechanism introduces a new in-band source of interference. That can be avoided by setting an extra, special restriction on z:

$$z>2T$$

It does not affect the validity of the formula (save for the implicit z>T condition), and so is noted as "advisory" in Table 13.

IMP Strategy (c)

The lo-mix choice dictates that $f_1=f_R-z$, hence $f_2>f_1$ for valid bounds of x, and y and the normal requirement that z>T. Equation 23 then becomes:

$$F_2=f_2+|(f_2-f_1)|=\Gamma+y+|((\Gamma+y)-(\Gamma+x-z))|=\Gamma+y+|(y-x+z)|$$

The assumption is made that the LO1 mechanism rules out any cases where z<T for a sensible super-heterodyne architecture, so the contents of the modulus, (x−y+z), must always be positive. The modulus operator can now be removed, keeping the implied positive sign.

$$F_2=\Gamma+2y-x+z$$

The upper edge of the resulting hazard band, $F_{2(MAX)}$, is manifested when the radio is tuned to the bottom of its range (x=0) and the interferer is at the top (y=T). Hence, $F_{2(MAX)}=\Gamma+2T+z$ The lower edge of the hazard band, $F_{2(MIN)}$, is manifested when the radio is tuned to the top of its range (x=T) and the interferer is at the bottom edge (y=0). Hence, $F_{2(MIN)}=\Gamma+z-T$ As z is brought down to the value 2T, parametrically, so the lower edge of the hazard band approaches and then touches the top of the tuned band. In the normally permissible range t<z<2T, the hazard band actually overlaps the tuned band, implying that the IMP mechanism introduces a new in-band source of interference. For example, if z=3T/2, then the hazard band extends from +T/2 to 3½T.

That can be avoided by setting an extra, special restriction on z:

$$z>2T$$

It does not affect the validity of the formula (save for the implicit z>T condition), and so is noted as "advisory" in Table 13.

IMP Strategy (d)

Equation 24 is applicable for the below-band i.m.p., using the same lo-mix substitution as for Strategy (c):

$$F_4=f_1-|(f_2-f_1)|=\Gamma+x-z-|((\Gamma+y)-(\Gamma+x-z))|$$

The assumption is made that the LO1 mechanism rules out any cases where z<T for a sensible super-heterodyne architecture, so the contents of the modulus, (x−y+z), must always be positive. The modulus operator can now be removed, keeping the implied positive sign.

$$F_4=\Gamma+2x-y-2z$$

The lower edge of the resulting hazard band, $F_{4(MIN)}$, is manifested when the radio is tuned to the bottom of its range (x=0) and the interferer is at the top (y=T). Hence, $F_{4(MIN)}=\Gamma-(T+2z)$ The upper edge of the hazard band, $F_{4(MAX)}$, is manifested when the radio is tuned to the top of its range (x=T) and the interferer is at the upper edge (y=0). Hence, $F_{4(MAX)}=\Gamma+2T-2z$ The upper edge just touches the bottom of the tuned band, implying a degree of self-protection, provided (advisory) z>T. There are no other pre-conditions (save for the implicit z>T condition).

Summary of IMP Formulations

TABLE 13

| | Interim formulation, IMP | | | | |
|---|---|---|---|---|---|
| | Conditional expression | | | Hazard band | |
| Strategy | (matches LO1 result) | Advisory on 'z' | Impact | from (lower edge) | to (upper edge) |
| a | z > T | z > T | above | $\Gamma - T + 2z$ | $\Gamma + 2T + 2z$ |
| B | z > T | z > 2T | below | $\Gamma - (T + z)$ | $\Gamma + 2T - z$ |

TABLE 13-continued

Interim formulation, IMP

| Strategy | Conditional expression (matches LO1 result) | Advisory on 'z' | Impact | Hazard band from (lower edge) | to (upper edge) |
|---|---|---|---|---|---|
| C | z > T | z > 2T | above | $\Gamma + z - T$ | $\Gamma + 2T + z$ |
| D | z > T | z > T | below | $\Gamma - T - 2z$ | $\Gamma + 2T + 2z$ |

Inverted Formulations

Survey of Data

The previous sections provide the set of expressions that determine the top and bottom of all the hazard bands for eleven spurious mechanisms. A hazard band can be defined completely once the radio's tuning range, mixer architecture and i.f. (z) have been specified.

The spectral EMC template introduces a means for predicting conflicts, such as harmful spurious emissions landing in radio-quiet bands protected by law, or spurious receiver responses lying in bands known to contain active emissions. The present method envisages running one template after another, each relating to one avoidance band, thus successively narrowing down the range of available i.f. The problem addressed in the following section, is to reverse the processes considered hitherto, and discover those ranges of z that evade such EMC violations, or compromises. By purely algebraic manipulations, it is possible to ascertain the extreme values (min., max) that bound closed ranges of z. At the boundary values, the top or bottom of a hazard band touches the lower or upper edge, respectively, of an avoidance band. In general, corresponding to the simplest template, there are two zones in which values of z avoid EMC conflict, the first being closed, and the second usually open-ended (to infinity). The first, running from $Z_L(\min)$ to $Z_L(\max)$ has been termed the "lagoon", the second running, after a brief pause, from $Z_O(\min)$ to infinity (ocean); $Z_O(\min) > Z_L(\max)$. (Note: the change of font for the canonical bounds on z.)

In general, each Strategy needs its own inversion formulation. However not all need detailed analysis. The 44 cells in Table 14 have been screened on the following logical basis as either "trivial" or substantial. For the substantial combinations, the analysis is required is labelled by the "Method" number, for ease of reference.

Strategies (a) and (c) address an avoidance band above the tuned band, and hence have no interaction with spurious responses/emission below the tuned band. The reverse applies for Strategies (b) and (d). Tables 1 to 13 state, for each Strategy, on which side of the tuned band the spurious response/emission has an impact.

TABLE 14

Scope of formula inversions

| Mechanism | Strategy (a) | Strategy (b) | Strategy (c) | Strategy (d) |
|---|---|---|---|---|
| IMG | Method 1 | trivial | trivial | Method 2 |
| LO1 | Method 3 | trivial | trivial | Method 4 |
| IFL | simple* | Method 5 | simple* | Method 6 |
| S2A | Method 7 | trivial | trivial | Method 8 |
| S2B | Method 9 | trivial | trivial | Method 10 |
| S3A | Method 11 | trivial | trivial | Method 12 |
| S3B | Method 13 | trivial | trivial | Method 14 |

TABLE 14-continued

Scope of formula inversions

| Mechanism | Strategy (a) | Strategy (b) | Strategy (c) | Strategy (d) |
|---|---|---|---|---|
| LA2 | Method 15 | trivial | Method 16 | Method 17 |
| LT2 | trivial | trivial | Method 18 | Method 19 |
| SUM | Method 20 | trivial | Method 21 | Method 22 |
| IMP | Method 23 | Method 24 | Method 25 | Method 26 |

*For the special case of IFL, the earlier assumption that the i.f. is much less than $\Gamma$ has been re-introduced into the inversion formulation as an explicit simple condition.

For clarity every non-holonomic expression in the form: $R - Sz < T$ will be rendered: $Sz > R + T$, indicating a $z > Z(\min)$ result, and every one in the form: $U - Vz > X$ will be rendered: $Vz < U - X$, indicating a $z < Z(\max)$ result.

Methods of Algebraic Inversion

Method 1 (IMG, Strategy a)

No pre-conditions on z are assumed here, such as are dictated by the pervasive LO1 mechanism. In fact the latter overrides the minimum, T/2, but that may be left to the point of application of LO1.

In the "lagoon", there are two constraints on z, conditional upon there being space sufficient for a spurious-hazard band between the top of the tuned band, $\Gamma$ to $\Gamma + T$, and the bottom of the avoidance band, $\Gamma + W$.

The lower edge of the hazard band must exceed the top of the tuned band, hence:

$$\Gamma + 2z > \Gamma + T$$

Result: $Z_L(\min) = T/2$ The upper edge of the hazard band must fall short of the avoidance band, hence:

$$\Gamma + T + 2z < \Gamma + W$$

Result: $Z_L(\max) = (W-T)/2 \{5\}$

For $Z_L(\max) > Z_L(\min)$, $W - T > T$

Condition (lagoon): $W > 2T$ For larger z, the lower edge of the hazard band must clear the top of the avoidance band, hence:

$$\Gamma + 2z > \Gamma + W + B$$

Open-ended result: $Z_O(\min) > (W+B)/2$

Method 2 (IMG, Strategy d)

No pre-conditions on z are assumed here, such as are dictated by the LO1 mechanism. In fact the latter overrides the minimum, T/2, but that may be left to the point of application of LO1.

In the "lagoon", there are two constraints on z, conditional upon there being space sufficient for a spurious-hazard band between the bottom of the tuned band, $\Gamma$ to $\Gamma+T$, and the top of the avoidance band, $\Gamma-W+B$.

The upper edge of the hazard band must fall short of the bottom of the tuned band, hence:

$$\Gamma+T-2z<\Gamma \text{ ergo } 2z>T$$

Result: $Z_L(\min)=T/2$

The lower edge of the hazard band must clear the avoidance band, hence:

$$\Gamma-2z>\Gamma+B-W \text{ ergo } 2z<W-B$$

Result: $Z_L(\max)=(W-B)/2$

For $Z_L(\max)>Z_L(\min)$, $W-B>T$

Condition (lagoon): $W-B>T$

For larger z, the upper edge of the hazard band must clear the bottom of the avoidance band, hence:

$$\Gamma+T-2z<\Gamma-W$$

Open-ended result: $Z_O(\min)=(W+T)/2$

Method 3 (LO1, Strategy a)

The lower edge of the hazard band must clear the top of the tuned band, hence:

$$\Gamma+z>\Gamma+T$$

Result: $Z_L(\min)=T$

The upper edge of the hazard band must fall short of the avoidance band, hence:

$$\Gamma+T+z<\Gamma+W$$

Result: $Z_L(\max)=W-T$

For $Z_L(\max)>Z_L(\min)$, $W-T>T$

Condition (lagoon): $W>2T$

For larger z, the lower edge of the hazard band must clear the top of the avoidance band, hence:

$$\Gamma+z>\Gamma+W+B$$

Open-ended result: $z>W+B$

Method 4 (LO1, Strategy d)

The upper edge of the hazard band must fall short of the bottom of the tuned band, hence:

$$\Gamma+T-z<\Gamma$$

Result: $Z_L(\min)=T$

The upper edge of the hazard band must fall short of the avoidance band, hence:

$$\Gamma+T+z<\Gamma+W$$

Result: $Z_L(\max)=W-T$

For $Z_L(\max)>Z_L(\min)$, $W-T>T$

Condition (lagoon): $W>2T$

For larger z, the lower edge of the hazard band must clear the top of the avoidance band, hence:

$$\Gamma+z>\Gamma+W+B$$

Open-ended result: $z>W+B$

Method 5 (IFL, Strategy b)

There is a direct restriction that z may not lie in the (lower) avoidance band, i.e. between $\Gamma-W$ and $\Gamma-W+B$. A "lagoon" could be defined to be from zero to $Z_L(\max)=\Gamma-W$, and then an open-ended range from $Z_O(\min)=\Gamma-W+B$ but that would have to be capped before the bottom of the tuned band, etc. In practice such numerical proximities rarely occur, and it is sufficient to treat z as being subject to a single maximum, $Z(\max)$. Hence:

Result: $Z(\max)=\Gamma-W$

Method 6 (IFL, Strategy d)

This follows the same method as Method 6, since the mixer architecture plays no part in this Mechanism. Note that this, and Method 5, is one of the few results in which the absolute value of the tuned band, $\Gamma$, enters explicitly.

Result: $Z(\max)=\Gamma-W$

Method 7 (S2A, Strategy a)

The lower edge of the hazard band must exceed the top of the tuned band, hence:

$$\Gamma+z/2>\Gamma+T$$

Result: $Z_L(\min)=2T$

The upper edge of the hazard band must fall short of the avoidance band, hence:

$$\Gamma+T+z/2<\Gamma+W$$

Result: $Z_L(\max)=2(W-T)$

For $Z_L(\max)>Z_L(\min)$, $2(W-T)>2T$

Condition (lagoon): $W>2T$

For larger z, the lower edge of the hazard band must clear the top of the avoidance band, hence:

$$\Gamma+z/2>\Gamma+W+B$$

Open-ended result: $Z_O(\min)>2(W+B)$

Method 8 (S2A, Strategy d)

The upper edge of the hazard band must fall short of the bottom of the tuned band, hence:

$$\Gamma+T-z/2<\Gamma \text{ ergo } z>2T$$

Result: $Z_L(\min)=2T$

The lower edge of the hazard band must clear the avoidance band, hence:

$$\Gamma-z/2>\Gamma+B-W \text{ ergo } z<2(W-B)$$

Result: $Z_L(\max)=2(W-B)$

For $Z_L(\max)>Z_L(\min)$, $2(W-B)>2T$

Condition (lagoon): $W-B>T$

For larger z, the upper edge of the hazard band must clear the bottom of the avoidance band, hence:

$$\Gamma+T-z/2<\Gamma-W$$

Open-ended result: $Z_O(\min)=2(W+T)$

Method 9 (S2B, Strategy a)
The lower edge of the hazard band must exceed the top of the tuned band, hence:

$$\Gamma+3z/2>\Gamma+T$$

Result: $Z_L(\min)=2T/3$
The upper edge of the hazard band must fall short of the avoidance band, hence:

$$\Gamma+T+3z/2<\Gamma+W$$

Result: $Z_L(\max)=2(W-T)/3$

For $Z_L(\max)>Z_L(\min)$, $2(W-T)>2T$

Condition (lagoon): $W>2T$
For larger z, the lower edge of the hazard band must clear the top of the avoidance band, hence:

$$\Gamma+3z/2>\Gamma+W+B$$

Open-ended result: $Z_O(\min)=2(W+B)/3$
Method 10 (S2B Strategy d)
The upper edge of the hazard band must fall short of the bottom of the tuned band, hence:

$$\Gamma+T-3z/2<\Gamma \text{ ergo } z>2T/3$$

Result: $Z_L(\min)=2T/3$
The lower edge of the hazard band must clear the avoidance band, hence:

$$\Gamma-3z/2>\Gamma+B-W \text{ ergo } z<2(W-B)/3$$

Result: $Z_L(\max)=2(W-B)/3$

For $Z_L(\max)>Z_L(\min)$, $2(W-B)/3>2T/3$

Condition (lagoon): $W-B>T$
For larger z, the upper edge of the hazard band must clear the bottom of the avoidance band, hence:

$$\Gamma+T-3z/2<\Gamma-W$$

Open-ended result: $Z_O(\min)=2(W+T)/3$
Method 11 (S3A, Strategy a)
The lower edge of the hazard band must exceed the top of the tuned band, hence:

$$\Gamma+2z/3>\Gamma+T$$

Result: $Z_L(\min)=3T/2$
The upper edge of the hazard band must fall short of the avoidance band, hence:

$$\Gamma+T+2z/3<\Gamma+W$$

Result: $Z_L(\max)=3(W-T)/2$

For $Z_L(\max)>Z_L(\min)$, $3(W-T)/2>3T/2$

Condition (lagoon): $W>2T$
For larger z, the lower edge of the hazard band must clear the top of the avoidance band, hence:

$$\Gamma+2z/3>\Gamma+W+B$$

Open-ended result: $Z_O(\min)=3(W+B)/2$

Method 12 (S3A, Strategy d)
The upper edge of the hazard band must fall short of the bottom of the tuned band, hence:

$$\Gamma+T-2z/3<\Gamma \text{ ergo } z>3T/2$$

Result: $Z_L(\min)=3T/2$
The lower edge of the hazard band must clear the avoidance band, hence:

$$\Gamma-2z/3>\Gamma+B-W \text{ ergo } z<3(W-B)/2$$

Result: $Z_L(\max)=3(W-B)/2$

For $Z_L(\max)>Z_L(\min)$, $3(W-B)/2>3T/2$

Condition (lagoon): $W-B>T$
For larger z, the upper edge of the hazard band must clear the bottom of the avoidance band, hence:

$$\Gamma+T-2z/3<\Gamma-W$$

Open-ended result: $Z_O(\min)=3(W+T)/2$
Method 13 (S3B, Strategy a)
The lower edge of the hazard band must exceed the top of the tuned band, hence:

$$\Gamma+4z/3>\Gamma+T$$

Result: $Z_L(\min)=3T/4$
The upper edge of the hazard band must fall short of the avoidance band, hence:

$$\Gamma+T+4z/3<\Gamma+W$$

Result: $Z_L(\max)=3(W-T)/4$

For $Z_L(\max)>Z_L(\min)$, $3(W-T)/4>3T/4$

Condition (lagoon): $W>2T$
For larger z, the lower edge of the hazard band must clear the top of the avoidance band, hence:

$$\Gamma+4z/3>\Gamma+W+B$$

Open-ended result: $Z_O(\min)=3(W+B)/4$
Method 14 (S3B, Strategy d)
The upper edge of the hazard band must fall short of the bottom of the tuned band, hence:

$$\Gamma+T-4z/3<\Gamma \text{ ergo } z>3T/4$$

Result: $Z_L(\min)=3T/4$
The lower edge of the hazard band must clear the avoidance band, hence:

$$\Gamma-4z/3>\Gamma+B-W \text{ ergo } z<3(W-B)/4$$

Result: $Z_L(\max)=3(W-B)/4$

For $Z_L(\max)>Z_L(\min)$, $3(W-B)/4>3T/4$

Condition (lagoon): $W-B>T$
For larger z, the upper edge of the hazard band must clear the bottom of the avoidance band, hence:

$$\Gamma+T-4z/3<\Gamma-W$$

Open-ended result: $Z_O(\min)=3(W+T)/4$

Method 15 (LA2, Strategy a)

As stated above, there is only an artificial distinction between the LA2 and LT2 Mechanisms. The possibility of conflict between the LO harmonic and the tuned band is disregarded for this, LA2, analysis.

The structure to the z constraints could be described as a conditional lagoon. The open-ended range of $z>Z_O(\min)$ always exists; there is no pre-condition. However, the lagoon range, $0<z<Z_L(\max)$ exists only if certain dimensions ($\Gamma$, T and W) of the EMC template satisfy a pre-condition.

The Open-ended Range

The lower edge of the hazard band must clear the avoidance band, hence:

$$2\Gamma+2z>\Gamma+W+B$$

$$\text{Ergo } 2z>W+B-\Gamma$$

The r.h.s. can be positive, zero or negative, whereas z can be positive only. Hence, if $W+B-\Gamma<0$, it is sufficient that $z>0$. In other words, ANY z is permissible.

If $W+B-\Gamma>0$ then a lower limit is set for z, i.e. $z>Z_O(\min)$. There is no need to define any pre-condition at all in this case. However, the non-holonomic expression needs to be split for coding, thus:

Result:

if ($\Gamma<W+B$)

then: $Z_O(\min)=(W+B-\Gamma)/2$ else: $Z_O(\min)=0$

The Lagoon

Here, the upper edge of the hazard band must fall short of the bottom of the avoidance band, hence:

$$2\Gamma+2z+2T<\Gamma+W$$

$$\text{Ergo } 2z<(W-\Gamma-2T)$$

The requirement for the r.h.s. to be positive, $(W-\Gamma-2T)/2>0$ leads to the pre-condition for the lagoon:

$\Gamma<W-2T$ i.e. $W>\Gamma+2T$ then $2z<2Z_L(\max)=(W-\Gamma-2T)/2$

Result: $Z_L(\max)=(W-\Gamma-2T)/2$

As a final check, compare $Z(\min)$ with $Z_L(\max)$: $Z(\min)-Z_L(\max)=B+2T$, which is always positive. Therefore, there is always a finite separation between the open-ended and "lagoon" ranges of z.

Method 16 (LA2, Strategy c)

The structure to the z constraints could be described as a conditional lagoon. The open-ended range of $z>Z_O(\min)$ always exists; there is no pre-condition. However, the lagoon range, $0<z<Z_L(\max)$ exists only if certain dimensions ($\Gamma$, B and W) of the EMC template satisfy a pre-condition The Open-ended Range The upper edge of the hazard band must fall short of the bottom of the avoidance band, hence:

$$2\Gamma-2z+2T>\Gamma+W$$

$$\text{Ergo } 2z>\Gamma+2T-W$$

The r.h.s. can be positive, zero or negative, whereas z can be positive only. Hence, if $\Gamma+2T-W<0$, it is sufficient that $z>0$. In other words, ANY z is permissible.

If $\Gamma+2T-W>0$ then a lower limit is set for z, i.e. $z>Z_O(\min)$. There is no need to define any pre-condition at all in this case. However, the non-holonomic expression needs to be split for coding, thus:

Result:

if ($\Gamma>W-2T$)

then: $Z_O(\min)=(\Gamma+2T-W)/2$else: $Z_O(\min)=0$

The Lagoon

Here, the lower edge of the hazard band must exceed the top of the avoidance band, hence:

$$2\Gamma-2z<\Gamma+W+B$$

$$\text{Ergo } z<(\Gamma-W-B)/2$$

The requirement for the r.h.s. to be positive, leads to the pre-condition for the lagoon:

Condition (lagoon): $\Gamma>W+B$

Result: $z<Z_L(\max)=(\Gamma-W-B)/2$

As a final check, compare $Z_O(\min)$ with $Z_L(\max)$: $Z_O(\min)-Z_L(\max)=B+2T$, which is always positive. Therefore, there is always a finite separation between the open-ended and "lagoon" ranges of z.

Method 17 (LA2, Strategy d)

Strictly, this Method describes a normal lagoon structure, with $0<z<Z_L(\max)$ in the lagoon, and $z>Z_O(\min)$ in the open-ended range. There are no pre-conditions. In practice this results in a simple upper limit to z.

The Open-ended Range

The upper edge of the hazard band must fall short of the bottom of the avoidance band, hence:

$$2\Gamma+2T-2z<\Gamma-W$$

Result: $z>Z_O(\min)=(W+2T+\Gamma)/2$

The r.h.s. indicates a $Z_O(\min)$ that is always positive and impracticably large.

The Lagoon

The lower edge of the hazard band must exceed the top of the avoidance band, hence:

$$2\Gamma+2T-2z>\Gamma-W+B$$

$$\text{Ergo } 2z<\Gamma+W-B$$

In the EMC templates for Strategies (c) and (d), W>B—the space between the tuned band and the (lower) avoidance band is W–B, which must be positive. So, in practice, there is no pre-condition on this lagoon structure; it always exists.

Result: $z<Z_L(\max)=(\Gamma+W-B)/2$

Method 18 (LT2, Strategy c)

This pseudo-mechanism is concerned solely with interference in the tuned band and does not address any EMC avoidance band. Method 18 is precisely the same as Method 19 except that it would be implemented in the software under Strategy (c) in conjunction with Method 16 (LA2—Strategy (c))

This Method describes a conditional lagoon structure, with $0<z<Z_L(\max)$ in the lagoon, and $z>Z_O(\min)$ in the open-ended range.

The Open-ended Range

The upper edge of the hazard band must fall short of the bottom of the tuned band, hence:

$$2\Gamma+2T-2z<\Gamma$$

Result: $z>Z_O(min)=(\Gamma+2T)/2$

The Lagoon

The lower edge of the hazard band must exceed the top of the tuned band, hence:

$$2\Gamma-2z>\Gamma+T$$

$$Ergo\ 2z<\Gamma-T$$

Since the r.h.s. must be positive, the pre-condition is:

Condition (lagoon): $\Gamma>T$

Result: $z<Z_L(max)=(\Gamma-T)/2$

Method 19 (LT2, Strategy d)

This pseudo-mechanism is concerned solely with interference in the tuned band and does not address any EMC avoidance band. Method 19 is precisely the same as Method 18 except that it would be implemented in the software under Strategy (d) in conjunction with Method 17 (LA2—Strategy (d))

The Open-ended Range

Result: $z>Z_O(min)=(\Gamma+2T)/2$

The Lagoon

Condition (lagoon): $\Gamma>T$

Result: $z<Z_L(max)=(\Gamma-T)/2$

Method 20 (SUM, Strategy a)

The structure to the z constraints could be described as a conditional lagoon. The open-ended range of $z>Z_O(min)$ always exists; there is no pre-condition. However, the lagoon range, $0<z<Z_L(max)$ exists only if certain dimensions ($\Gamma$, B and W) of the EMC template satisfy a pre-condition The Open-ended Range The upper edge of the hazard band must fall short of the bottom of the avoidance band, hence:

$$2\Gamma+z>\Gamma+W+T$$

$$Ergo\ z>W+B-F$$

The r.h.s. can be positive, zero or negative, whereas z can be positive only. Hence, if $W+B-\Gamma<0$, it is sufficient that $z>0$. In other words, ANY z is permissible.

If $W+B-\Gamma>0$ then a lower limit is set for z, i.e. $z>Z_O$(min). There is no need to define any pre-condition at all in this case. However, the non-holonomic expression needs to be split for coding, thus:

Result:

if $(\Gamma>W+B)$ then: $Z_O(min)=(W+B-F)$ else: $Z_O(min)=0$

The Lagoon

Here, the upper edge of the hazard band must fall short of the bottom of the avoidance band, hence:

$$2\Gamma+2T+z<\Gamma+W$$

$$Ergo\ z<(W-2T-\Gamma)$$

The requirement for the r.h.s. to be positive, leads to the pre-condition for the lagoon:

Condition (lagoon): $\Gamma<W-2T$

Result: $z<Z_L(max)<(W-2T-\Gamma)$

Method 21 (SUM, Strategy c)

In practice, this Method describes a normal lagoon structure, with $0<z<Z_L(max)$ in the lagoon, and $z>Z_O(min)$ in the open-ended range. There are no pre-conditions.

The Open-ended Range

The upper edge of the hazard band must fall short of the bottom of the avoidance band, hence:

$$2\Gamma+2T-z<\Gamma+W$$

$$Ergo\ z>\Gamma+2T-W$$

The r.h.s. can be positive, zero or negative, whereas z can be positive only. Hence, if $\Gamma+2T-W<0$, it is sufficient that $z>0$. In other words, ANY z is permissible.

If $\Gamma+2T-W>0$ then a lower limit is set for z, i.e. $z>Z_O$ (min). There is no need to define any pre-condition at all in this case. However, the non-holonomic expression needs to be split for coding, thus:

Result:

if $(\Gamma>W-2T)$ then: $Z_O(min)=(\Gamma+2T-W)$ else: $Z_O(min)=0$

The Lagoon

The lower edge of the hazard band must exceed the top of the avoidance band, hence:

$$2\Gamma-z>\Gamma+W$$

$$Ergo\ z<\Gamma-W$$

The requirement for the r.h.s. to be positive leads to the pre-condition, $W>\Gamma$.

Condition (lagoon): $W>\Gamma$

Result: $z<Z_L(max)=\Gamma-W$

Method 22 (SUM, Strategy d)

In practice, this Method yields a simple upper limit to z, since, on the lagoon analogy, the open-ended range of z (i.f.) would start well above the lower end of the tuned band. That option is hereby discarded.

The proof is given, for the sake of completeness.

The upper edge of the hazard band would have to fall short of the bottom of the avoidance band, hence:

$$2\Gamma+2T-z'<\Gamma-W\ leading\ to\ z'>\Gamma+2T+W>\Gamma\ always.$$

What, then should have a lagoon, now becomes the simple upper limit, thus:

The lower edge of the hazard band must exceed the top of the avoidance band, hence:

$$2\Gamma-z>\Gamma-W+B$$

$$Ergo,\ z<\Gamma+W-B$$

In the EMC templates for Strategies (c) and (d), $W-B>0$, making the r.h.s. positive always so that there is no pre-condition; the lagoon always exists.

Result: $z<Z(min)=\Gamma+W-B$

Method 23 (IMP, Strategy a)

This method produces an open-ended constraint, and a normal lagoon. The lower limit in the lagoon is the obligatory $z>T$ implicit in the formula, which also matches the "advisory" lower limit of $z>T$ as stated in Table 14.

Open-ended
The lower edge of the hazard band must exceed the top of the avoidance band, hence:

$$\Gamma-T+2z > \Gamma+W+B$$

Ergo, $z > (W+T+B)/2$

The "advisory" constraint, $z>T$, is superimposed, by formulating the equivalent of the Boolean logic:

$$[Z_O(\min) \geq (W+T+B)/2] \text{ AND } [Z_O(\min) \geq T]$$

It is also partly covered if $(W+T+B)/2 > T$ i.e. if $W+B>T$, otherwise we force $Z_O(\min)=T$.
That non-holonomic logical expression needs to be split for coding, thus:
Result:

if $(W+B>T)$ then: $Z_O(\min)=(W+T+B)/2$ else: $Z_O(\min)=T$

Lagoon
The upper edge of the hazard band must fall short of the bottom of the avoidance band, hence:

$$\Gamma+2T+2z < \Gamma+W$$

Ergo, $2z < W-2T$

The r.h.s. must be positive for the lagoon to exist, hence the pre-condition, $W>2T$.
The additional "advisory" constraint is simply included by raising the threshold from zero to T. At the same time, any lagoons that may exist for $0<z<T$ are invalidated. The pre-condition may now be tightened, thus:

$$2z > 2T$$

$$2T < 2z < (W-2T), \text{ ergo } W > 4T$$

Condition (lagoon): $W>4T$
Result: $T<z<Z_L(\max)=(W-2T)/2$
Method 24 (IMP, Strategy b)
This method produces an open-ended constraint, and a normal lagoon. The lower limit in the lagoon is the "advisory" lower limit of $z>2T$ as stated in Table 14, (not $z>T$ implicit in the formula).
Open-ended
The upper edge of the hazard band must fall short of the bottom of the avoidance band, hence:

$$\Gamma+2T-z < \Gamma-W$$

Ergo, $z > W+2T$

The r.h.s. is always positive, ergo no pre-condition arises.
The "advisory" constraint, $z>2T$, is automatically covered, yielding the following plain expression:
Result: $z > Z_O(\min)=W+2T$
Lagoon
The lower edge of the hazard band must exceed the top of the avoidance band, hence:

$$\Gamma-T-z > \Gamma-W+B$$

Ergo, $z < W-T-B$

The r.h.s. must be positive for the lagoon to exist, leading to the pre-condition, $W>T+B$.

The additional "advisory" constraint is now included, by raising the threshold from zero to 2T. At the same time, any lagoons that may exist for $0<z<2T$ are invalidated. The pre-condition may now be tightened, thus:

$$2T < z < W-T-B, \text{ ergo } W > 3T+B$$

Condition (lagoon): $W>3T+B$
Result: $2T<z<Z_L(\max)=(W-T-B)$
Method 25 (IMP, Strategy c)
This method produces an open-ended constraint, and a normal lagoon. The lower limit in the lagoon is the "advisory" lower limit of $z>2T$ as stated in Table 14, (not $z>T$ implicit in the formula).
Open-ended
The lower edge of the hazard band must exceed the top of the avoidance band, hence:

$$\Gamma-T+z > \Gamma+W+B$$

Ergo, $z > W+T+B$

The implicit constraint, $z>T$, is automatically covered the "advisory" constraint, $z>2T$. The "advisory" constraint, $z>2T$, is now superimposed, by formulating the equivalent of the Boolean logic:

$$[Z_O(\min) \geq (W+T+B)] \text{ AND } [Z_O(\min) \geq 2T]$$

It is also partly covered if $(W+T+B) > 2T$ i.e. if $W+B>T$, otherwise we force $Z_O(\min)=T$.
That non-holonomic logical expression needs to be split for coding, thus:
Result:

if $(W+B>T)$ then: $Z_O(\min)=(W+T+B)$ else: $Z_O(\min)=2T$

Lagoon
The upper edge of the hazard band must fall short of the bottom of the avoidance band, hence:

$$\Gamma+2T+z < \Gamma+W$$

Ergo, $z < W-2T$

The r.h.s. must be positive for the lagoon to exist, hence the pre-condition, $W>2T$.
The additional "advisory" constraint is now included by simply raising the threshold from zero to 2T. At the same time, any lagoons that may exist for $0<z<2T$ are invalidated. The pre-condition may now be tightened, thus:

$$2T < z < W-2T, \text{ ergo } W > 4T$$

Condition (lagoon): $W>4T$
Result: $2T<z<Z_L(\max)=(W-2T)$
Method 26 (IMP, Strategy d)
This method produces an open-ended constraint, and a normal lagoon. The lower limit in the lagoon is the implicit $z>T$, which also covers the "advisory" lower limit of $z>T$ as stated in Table 14.

Open-ended

The upper edge of the hazard band must fall short of the bottom of the avoidance band, hence:

$$\Gamma+2T-2z<\Gamma-W$$

Ergo, $z>(W+2T)/2=T+W/2$

The r.h.s. is always positive, ergo no pre-condition arises.

Both the implicit and "advisory" constraint, $z>T$, is automatically covered, yielding the following plain expression:

Result: $z>Z_O(min)=(W+2T)/2$

Lagoon

The lower edge of the hazard band must exceed the top of the avoidance band, hence:

$$\Gamma-T-2z>\Gamma-W+B$$

Ergo, $z<(W-T-B)/2$

The r.h.s. must be positive for the lagoon to exist, leading to the pre-condition, $W>T+B$.

The additional "advisory" constraint is now included, by raising the threshold from zero to T. At the same time, any lagoons that may exist for $0<z<2T$ are invalidated. The pre-condition may now be tightened, thus:

$$2T<2z<W-T-B, \text{ ergo } W>3T+B$$

Condition (lagoon): $W>3T+B$

Result: $T<z<Z_L(max)=(W-T-B)/2$

Additional Formulations

At the current build state, versions of the present invention implement the eleven spurious-generating mechanisms described above. Several more mechanisms are considered to be suitable candidates for the next software upgrade.

Chief among them are L3A and L3T, which do for the third harmonic what L2A and L2T do for the second harmonic of the 1 LO. It is considered next in order of importance because, whilst the radio frequencies concerned will be further out from the tuned band, the level of generation is strong.

In typical ring mixers, the local-oscillator (1 LO) waveform is generated at a high level and then used to over-drive the mixer diodes. The result is a voltage versus time waveform that approximates a square wave, rich in odd-order harmonics, the third, fifth, etc. The even-order harmonics represent an imbalance in the design of any ring mixer, or analogous types. Hence, the second harmonic is a maverick case, the failure to perfect the performance of the first mixer, whereas, the third and other odd-order harmonics are unavoidable.

Analysis of Third Harmonic of 1LO

As with the treatment of the LA2 and LT2 Mechanisms, it turns out that the separate application of two "layered" Mechanisms, LA3 and LT3, fairly straightforward by themselves, accomplishes the equivalent of a very complex algorithm, and one that would prove hard to verify.

One of the accepted constraints of the super-heterodyne architecture is that the tuning range may not exceed the value of the first i.f. That keeps the local oscillator always above (hi-mix) or below (lo-mix) the receiver's tuning band, and enables any local oscillator leakage to be attenuated by the receiver's front-end "roofing" filter. It leads to an implicit requirement, $z \geq T$ (Equation 17)

For the hi-mix architecture, the local oscillator itself and its third harmonic are necessarily above the tuned band of the receiver (or sender) and the harmonic can interact only with the designated "avoidance" band. That simpler case gives rise to the "avoidance band only" qualification of the LA3 mechanism,.

For the lo-mix architecture, the local oscillator is always below the tuned band, $\Gamma$ to $\Gamma+T$, as constrained by Equation 17. However, given a large enough z, the third harmonic (as also any higher harmonics) may fall into the tuned band under certain numerical conditions.

To keep things simple, the pseudo "mechanism", LT3, is coined that ignores the designated avoidance band of the EMC template, addressing only the tuned band, $\Gamma$ to $\Gamma+T$. Clearly, both mechanisms must be applied in all cases to clear the possibility of:

interference to other users of the tuned band, including self interference if the receiver is tuned to the second harmonic of its own local oscillator;

interference to other users of the avoidance band.

It is the successive application (e.g. inside TxRx__plannner) that effects the power of this method; successive elimination in effect implements the complex logical manipulations that would otherwise have required elaborate an obscure coding.

TABLE 15

Third Harmonic of Local Oscillator

| strategy | Conditional expression | Impact | Hazard band from (lower edge) | to (upper edge) |
|---|---|---|---|---|
| a & b | no conditions | above | $3\Gamma + 3z$ | $3\Gamma + 3T + 3z$ |
| c & d | no conditions | BOTH | $3\Gamma - 3z$ | $3\Gamma + 3T - 3z$ |

Following the pattern of the Mechanism inversion in Section 11.1, the only non-trivial strategies to consider are: (a), (c) and (d) for the LA3, and (c) and (d) for the LT3.

As with the LA2 correspondent, the pre-condition, $z>T$, is assumed to have been imposed by the LO1 Mechanism, and will not be repeated here below.

LA3 Strategy (a)

The structure to the z constraints could be described as a conditional lagoon. The open-ended range of $z>Z_O(min)$ always exists; there is no pre-condition. However, the lagoon range, $0<z<Z_L(max)$ exists only if certain dimensions ($\Gamma$, T and W) of the EMC template satisfy a pre-condition.

The Open-ended Range

The lower edge of the hazard band must exceed the top of the avoidance band, hence:

$$3\Gamma+3z>\Gamma+W+B$$

$$3z>W+B-2\Gamma$$

The r.h.s. can be positive, zero or negative, whereas z can be positive only. Hence, if $2\Gamma>W+B$, it is sufficient that $z>0$. In other words, ANY z is permissible.

If $2\Gamma>W+B$ then a lower limit is set for z, i.e. $z>Z_O(min)$. There is no need to define any pre-condition at all in this case. However, the non-holonomic expression needs to be split for coding, thus:

Result:

if $(\Gamma>W+B)$ then: $Z_O(min)=(W+B-\Gamma)/3$ else: $Z_O(min)=0$

The Lagoon

The upper edge of the hazard band must fall short of the bottom of the avoidance band, hence:

$$3\Gamma+3T+3z<\Gamma+W$$

$$3z<W-2\Gamma-3T$$

The r.h.s. must be positive for the lagoon to exist, hence the pre-condition, $2\Gamma<W-3T$.

Condition (lagoon): $W>2\Gamma+3T$

Result: $z<Z_L(\max)=(W-2\Gamma-3T)/3$

Corollary: either the open-ended, or the lagoon cases will yield practical values of z. The forbidden range between $Z_L(\max)$ and $Z_O(\min)$, when it exists, is $(B+3T)/3$.

LA3 Strategy (c)

In practice, the structure to the z constraints is a conditional lagoon. The open-ended range of $z>Z_O(\min)$ always exists but is impractically high; there is no pre-condition.

The Open-ended Range

The upper edge of the hazard band must fall short of the bottom of the avoidance band, hence:

$$3\Gamma+3T-3z<\Gamma+W$$

$$3z>2\Gamma+3T-W$$

The r.h.s. can be positive, zero or negative, whereas z can be positive only. Hence, if $W>2\Gamma+3T$, it is sufficient that $z>0$. In other words, ANY z is permissible.

If $2\Gamma>W-3T$ then a lower limit is set for z, i.e. $z>Z_O(\min)$. There is no need to define any pre-condition at all in this case. However, the non-holonomic expression needs to be split for coding, thus:

Result:

if $(2\Gamma>W-3T)$ then: $Z_O(\min)=(2\Gamma+3T-W)/3$ else: $Z_O(\min)=0$

The Lagoon

The lower edge of the hazard band must exceed the top of the avoidance band, hence:

$$3\Gamma-3z<\Gamma+W+B$$

$$3z<2\Gamma-W-B$$

The r.h.s. must be positive for the lagoon to exist, hence the pre-condition, $2\Gamma>W+B$.

Condition (lagoon): $\Gamma>(W+B)/2$

Result: $z<Z_L(\max)=(2\Gamma-W-B)/3$

The forbidden range between $Z_L(\max)$ and $Z_O(\min)$, when it exists, is $(B+3T)/3$.

LA3 Strategy (d)

Strictly, the structure to the z constraints is a lagoon. The open-ended range of $z>Z_O(\min)$ always exists but is impractically high; there is no pre-condition. In practice this results in a simple upper limit to z.

The Open-ended Range

The upper edge of the hazard band must fall short of the bottom of the avoidance band, hence:

$$3\Gamma+3T-3z<\Gamma-W$$

$3z>W+2\Gamma+3T$ always positive, and impractical to implement.

The Lagoon

The lower edge of the hazard band must exceed the top of the avoidance band, hence:

$$3\Gamma-3z>\Gamma-W+B$$

$$3z<2\Gamma+W-B$$

The r.h.s. must be positive for the lagoon to exist, hence the pre-condition, $2\Gamma>B-W$.

In the EMC templates for Strategies (c) and (d), $\Gamma>W>B$ hence the r.h.s. cannot but be positive; there is no pre-condition on the lagoon.

Result: $z<Z_L(\max)<(2\Gamma+W-B)/3$

LT3

This pseudo-mechanism is concerned solely with interference in the tuned band and does not address any EMC avoidance band. As before, (LT2), the following formulation is shared by both Strategy (c), and Strategy and (d).

The structure to the z constraints could be described as a conditional lagoon. The open-ended range of $z>Z_O(\min)$ always exists; there is no pre-condition. However, the lagoon range, $0<z<Z_L(\max)$ exists only if certain dimensions ($\Gamma$ and T) of the EMC template satisfy a pre-condition.

The Open-ended Range

The upper edge of the hazard band must fall short of the bottom of the tuned band, hence:

$$3\Gamma+3T-3z<\Gamma$$

$z>(3T+2\Gamma)/3$—always large and positive, leading to another impractical range of z.

The Lagoon

The lower edge of the hazard band must exceed the top of the tuned band, hence:

$$3\Gamma-3z>\Gamma+T$$

$$z<(2\Gamma-T)/3$$

The r.h.s. must be positive for the lagoon to exist, hence the pre-condition, $2\Gamma>T$, hence the pre-condition that $T<\Gamma/2$.

Condition (lagoon): $\Gamma>2T$

Result: $z<Z_L(\max)=(2\Gamma-T)/3$

Other Harmonics of the 1 LO

Comparison of the formulations for LA2 and LA3, and LT2 and LT3 indicates an induction formula. It is presented in Table 17 below together with an example for the fifth harmonic. Note: $m=(n-1)$.

TABLE 16

Induction formulation for higher harmonics of 1 LO

| Formula | | LA2 | LA3 | LA5 | LAn |
|---|---|---|---|---|---|
| Strat (a) - open | $Z_O$(min) | $(W + B - \Gamma)/2$ | $(W + B - \Gamma)/3$ | $(W + B - \Gamma)/5$ | $(W + B - \Gamma)/n$ |
| lagoon condition | | $W > \Gamma + 2T$ | $W > 2\Gamma + 3T$ | $W > 4\Gamma + 5T$ | $W > m\Gamma + nT$ |
| Strat (a) lagoon | $Z_L$(max) | $(W - \Gamma - 2T)/2$ | $(W - 2\Gamma - 3T)/3$ | $(W - 4\Gamma - 5T)/5$ | $(W - m\Gamma - nT)/n$ |
| Strat (c) - open | $Z_O$(min) | $(\Gamma + 2T - W)/2$ | $(2\Gamma + 3T + W)/3$ | $(4\Gamma + 5T - W)/5$ | $(m\Gamma + nT - W)/n$ |
| lagoon condition | | $\Gamma > W + B$ | $2\Gamma > W + B$ | $4\Gamma > W + B$ | $m\Gamma > W + B$ |
| Strat (c) lagoon | $Z_L$(max) | $(\Gamma + W + B)/2$ | $(2\Gamma - W - B)/3$ | $(4\Gamma - W - B)/5$ | $(m\Gamma - W - B)/n$ |
| Strat (d) - open | $Z_O$(min) | $(W + 2T + \Gamma)/2$ | $(W + 3T + 2\Gamma)/3$ | $(W + 5T + 4\Gamma)/5$ | $(W + nT + m\Gamma)/n$ |
| Strat (d) lagoon | $Z_L$(max) | $(\Gamma + W - B)/2$ | $(2\Gamma + - B)/3$ | $(4\Gamma + W - B)/5$ | $(m\Gamma + W - B)/n$ |
| LTx Strat (c)/(d) | | LT2 | LT3 | LT5 | LTn |
| open-ended | $Z_O$(min) | $(\Gamma + 2T)/2$ | $(2\Gamma + 3T)/3$ | $(4\Gamma + 5T)/5$ | $(m\Gamma + nt)/n$ |
| lagoon condition | | $\Gamma > T$ | $\Gamma > 2T$ | $\Gamma > 4T$ | $\Gamma > mT$ |
| lagoon | $Z_L$(max) | $(\Gamma - T)/2$ | $(2\Gamma - T)/3$ | $(4\Gamma - T)/5$ | $(m\Gamma - T)/n$ |

As discussed in the introduction to this specification, the method of the invention is preferably carried out with a suitably programmed computer which is equipped with the formulae set out above. A graphical user interface or GUI will guide a user through the steps needed to carry out the method. One possible operating process is described below.

Let us assume that the computer is pre-programmed with the formulae for all of the eleven spurious mechanisms described above. As a first step, the user will be asked to select which mechanisms are to be used in the process. Unless the product is a transceiver with identical send and receive intermediate frequencies, the selection of mechanisms will usually be a subset of the eleven, depending primarily on whether product is a transmitter or receiver. The user may also at this stage rank the chosen mechanisms according to their significance although the program will usually have a default ranking order.

Having selected a plurality of spurious mechanisms, the user has an opportunity to input an i.f. range. Next, the user defines the parameters $\Gamma$, T and W and B (see FIG. 5), and whether hi-mix or lo-mix is desired.

The computer program then uses the formulae discussed above to determine which frequencies, from the full range of intermediate frequencies input by the operator, result in spurious emissions to or responses from the avoidance band for any part of the tuning range. The output may be in the form of a graph with intermediate frequency along one axis and on the other axis some indication as to which is the most significant spurious mechanism for that i.f or i.f. range.

The process may then be repeated for additional avoidance bands since in a practical situation there are usually several avoidance bands.

Figure 7:
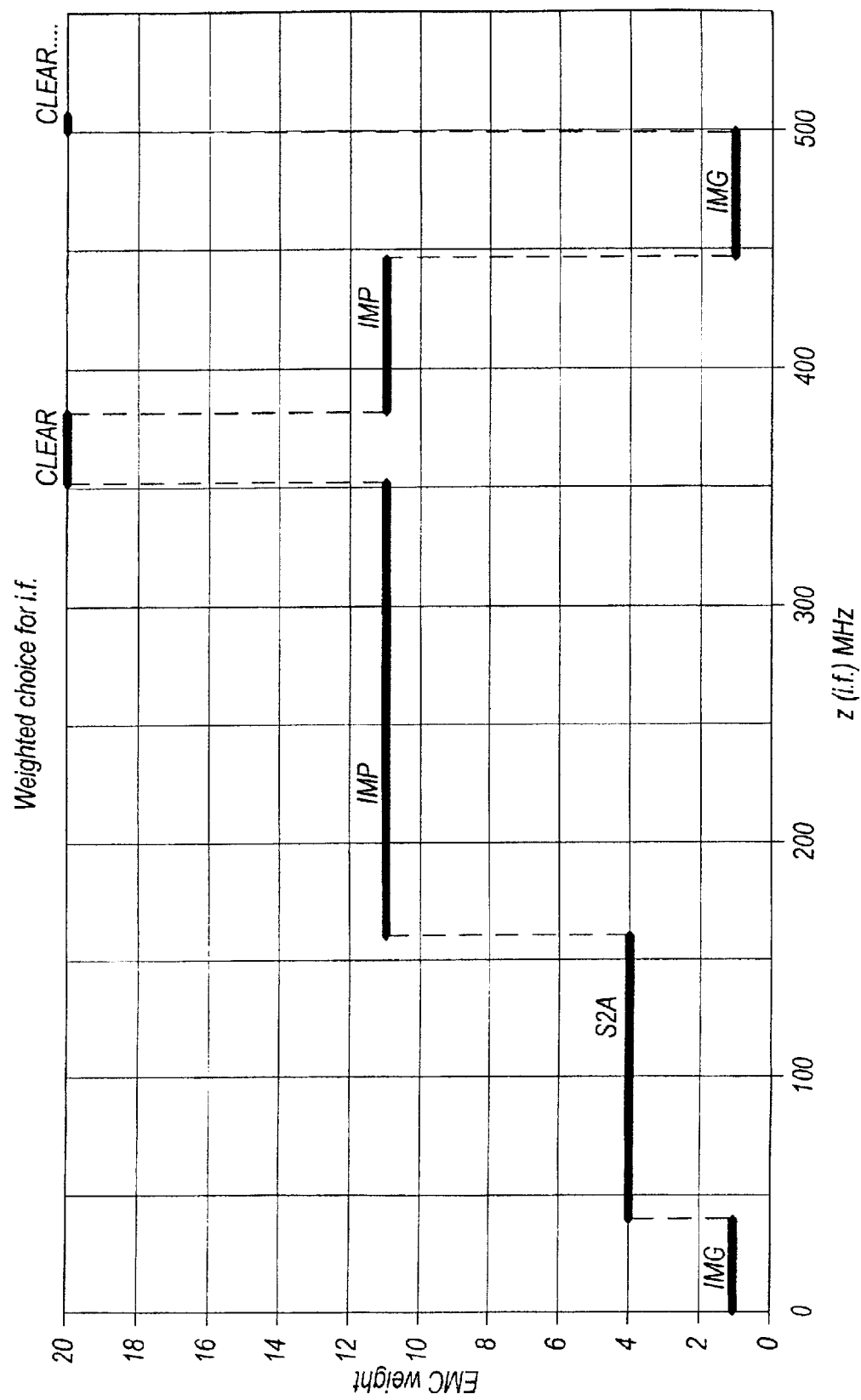
FIG. 7 is a graph showing the output results of the method in terms of spurious mechanism versus intermediate frequency.
Figure 8:
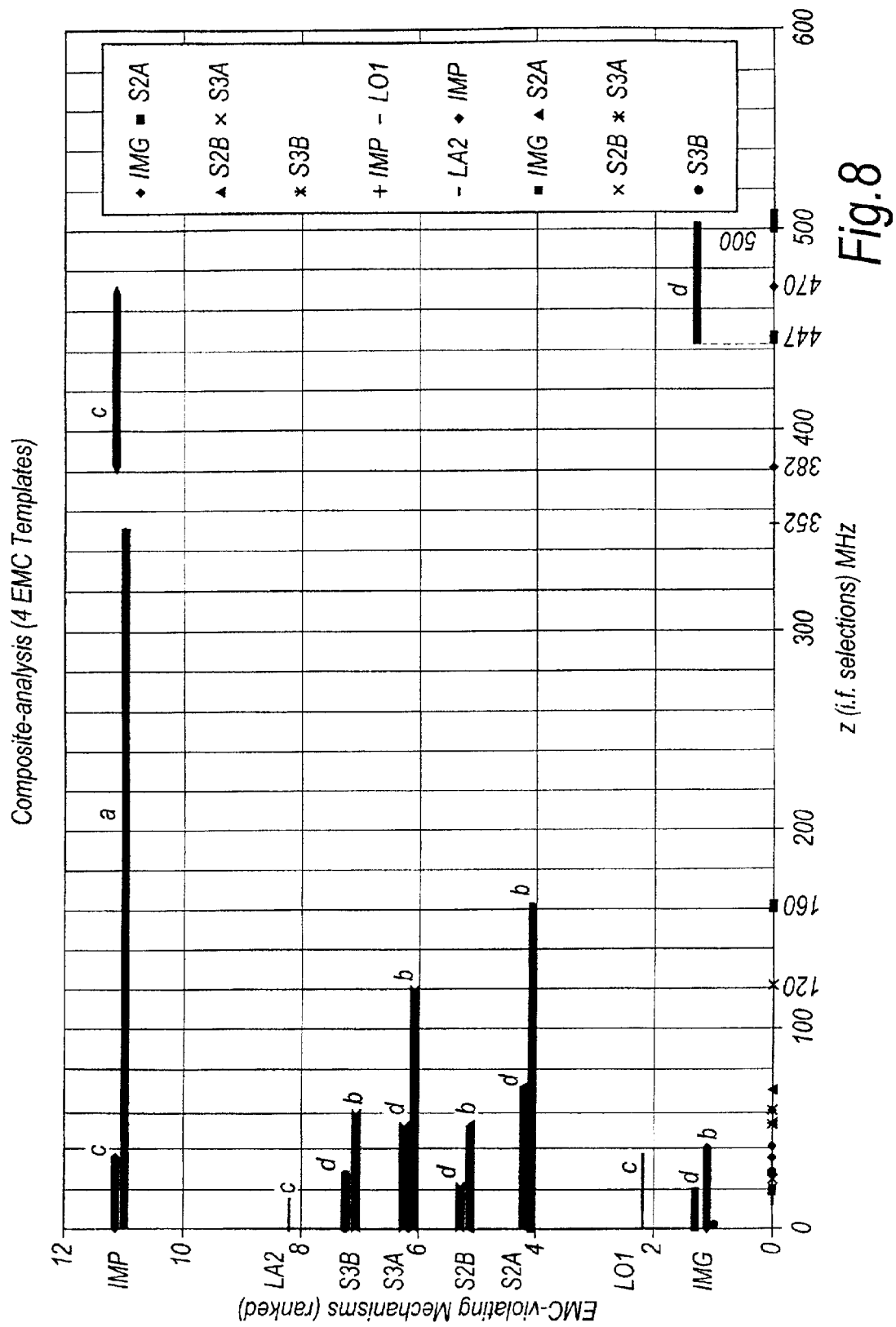
FIG. 8 is a graph similar to FIG. 7 showing the results in simplified form.

An exemplary set of results is illustrated in FIGS. 7 and 8. In order to generate these results, four avoidance bands were defined, namely:

(a) TV Band IV (to protect reception of third parties)
(b) GSM downlink (co-located transmitter emissions)
(c) DCS (digital cellular system) uplink (to protect nearby receivers)
(d) DCS downlink (nearby transmitter emissions)

Eight of the spurious mechanisms were considered as indicated on the vertical axis of FIG. 7, ranked with the most significant (IMG) at the bottom. FIG. 7 indicates that certain ranges of z give rise to spurious emissions responses to/from the avoidance bands as indicated. To facilitate the choice of z, the results may be presented as in FIG. 8 with the most significant mechanism plotted against z. In the range of z from 0–500 MHz, there is one range of z that does not result in spurious emissions responses between 352 MHz and 382 MHz. If there was no "clear" range, the operator might compromise the choice of z and decide that the least significant spurious mechanism could be accepted (or possibly screened out by hardware). Thus if IMP was disregarded, the whole of the range from 160 to 447 MHz would be "clear". Alternatively, if there was no clear range the operator might repeat the process with a different range of z and/or a choice of hi/lo mix or a different tuning range.

Figure 9:
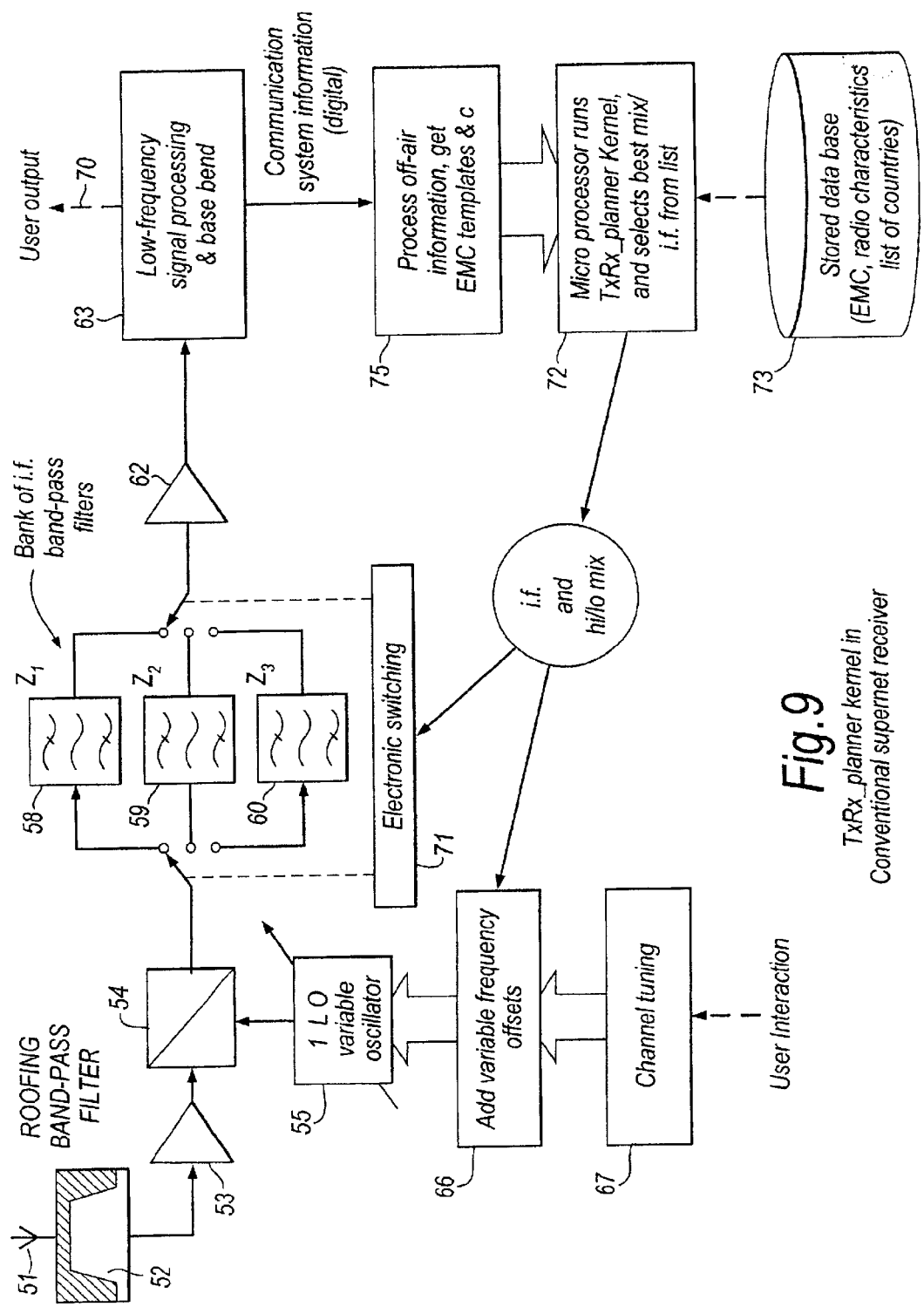
FIG. 9 shows how apparatus according to the invention might be incorporated in a conventional super-heterodyne receiver.

FIG. 9 is a schematic diagram showing how a conventional super-heterodyne receiver could be modified to incorporate apparatus for varying the intermediate frequency according to prevailing conditions, Many of the components are the same as in FIG. 1, thus signals are received by receiving antenna 51, passed through roofing filter 52 (which lets in only the wanted r.f. band) and amplified by front end low noise amplifier 53 before being input to mixer 54. Here signals are mixed with a signal from a local oscillator 55 of variable frequency, to be described in more detail below, and the output is filtered by a selected one of a bank of i.f. band pass filters 58, 59, 60 (more than three would be present in a practical example). The filter output is amplified again by amplifier 62 and subject to low frequency signal processing 63, demodulation and base band filtering before the user output e.g. audio is supplied as indicated at 70.

The receiver of FIG. 9 is additionally provided with microprocessor 72 which carries out the i.f. selection process discussed above. The processor 72 may have a stored database 73 containing, for example, electromagnetic compatibility data, and radio characteristics of different countries. It uses this database information, together with off-air broadcast information decoded by processor 75, to calculate a suitable intermediate frequency and/or whether the mix should be high or low. The broadcast information may include, for example, the country in which the radio is now operating.

Information from the microprocessor 72 is conveyed to a tuning controller 66 which controls the frequency of local oscillator 55 according to the selected value of z and whether the mix is high or low. The microprocessor output is also input to electronic switching 71 to switch into operation the appropriate band pass filter 58, 59 or 60 according to the choice of z.

In addition to tuning controller 66 the usual user operated tuning controller 67 is provided to enable the user to tune to the appropriate r.f. for a selected channel.

The local oscillator 55 needs to be variable over a wide range to cover all intermediate frequencies and the fill r.f. tuning range. Since this would be a relatively expensive item then it might be replaced with a module having embedded synthesiser techniques.

In an alternative arrangement, a bank of electronically tunable filters could replace items 58 to 60 being able to tune up to the lower band of the next in order to cover a contiguous range of i.f. options. For any particular i.f. as indicated by the selection software, the most suitable tuned filter could then be switched in circuit and fine-tuned to the exact i.f. required. Then the local oscillator would be tuned to select the wanted radio channel in exactly the same way as in FIGS. 2 and 9.

Figure 10:
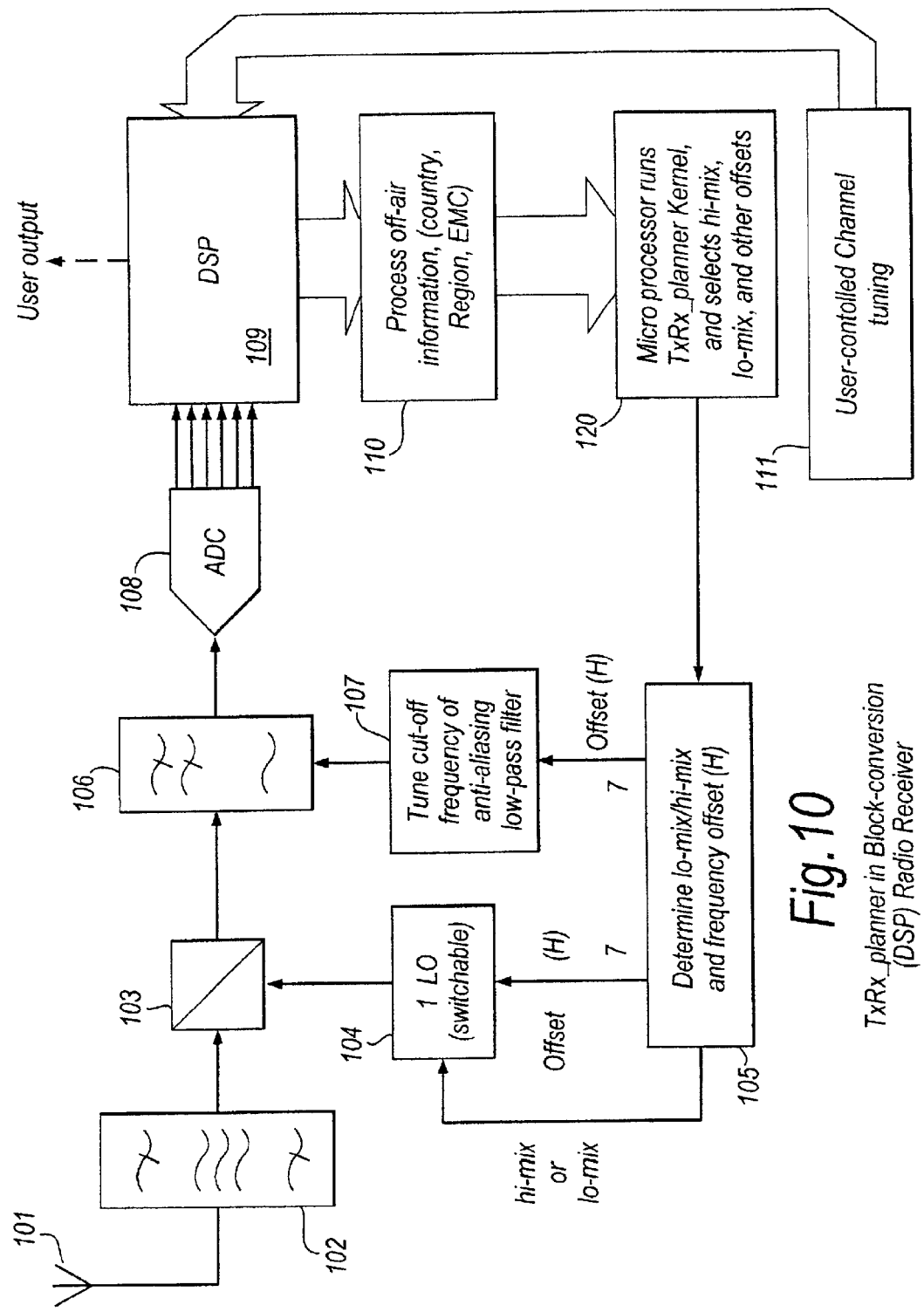
FIG. 10 shows how apparatus according to the invention might be incorporated in a DSP radio receiver.

FIG. 10 is a block schematic diagram showing how a block conversion receiver might be modified to incorporate the present invention.

Signals received via antenna 101 are passed through wide band roofing filter 102 and supplied to a down converter 103 which might be a mixer or a digital sample-and-hold device. Converter 103 receives an input from a local oscillator 104 or a clock generator for digital sampling. A tuning controller 105 controls local oscillator 104 according to the lo-mix/hi mix and frequency offset (H) choice (see FIG. 3) determined by a microprocessor 120 carrying out the process of the invention. The low pass filter 106 removes high mixer/sampler products that would cause aliasing to pass a band of down-converted signals which are digitised in ADC 108 and processed by processor 109 to provide user output. Any broadcast off air information is also processed in processor 120 and output to microprocessor 120 to determine the appropriate offset H. The output is used by controller 105 to control the local oscillator 104 as noted above and by tuning circuit 107 to tune the cut off frequency of filter 106. A further tuner 111 is operable by the user to select a channel for reception.

Figure 11A:
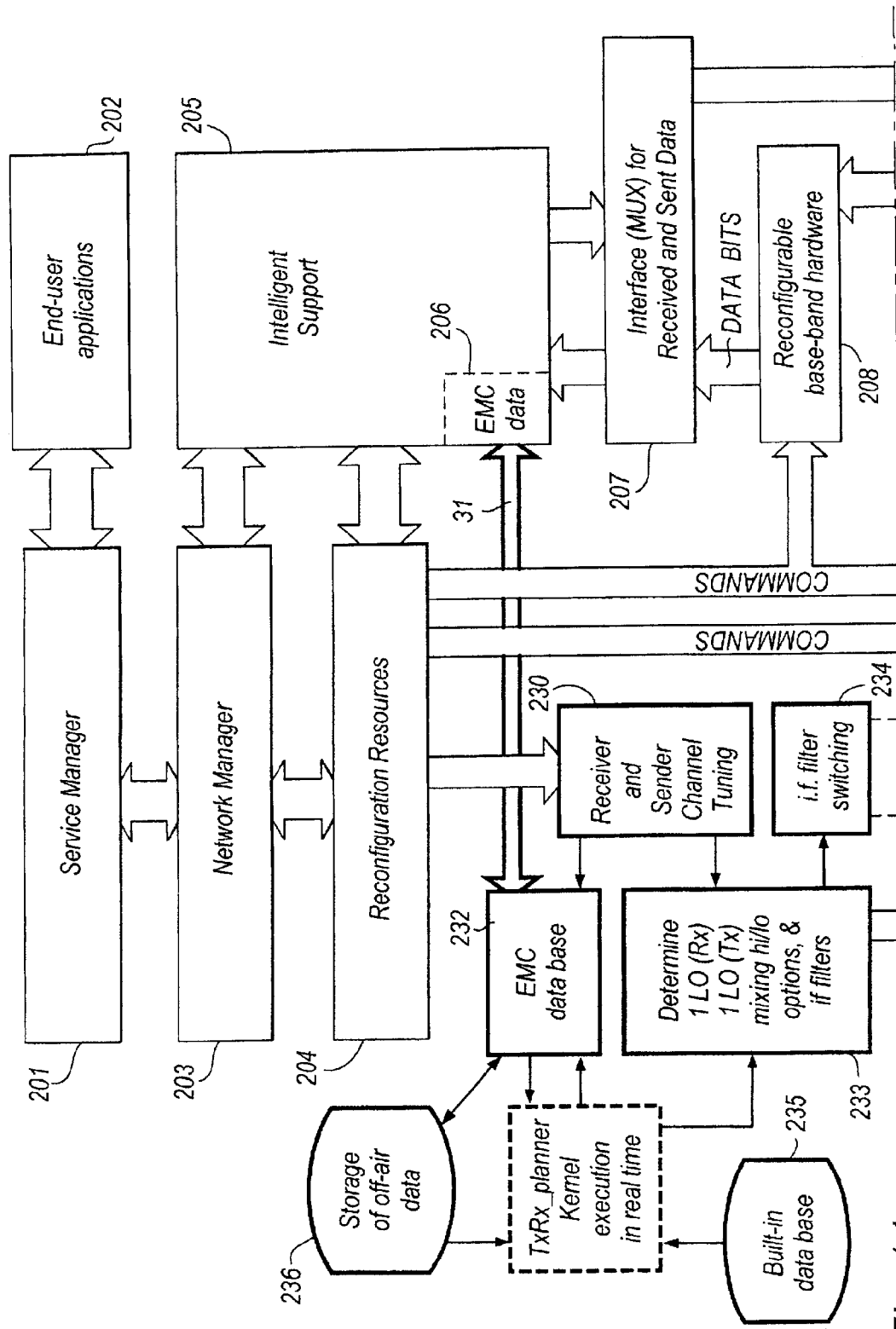
FIG. 11 shows how apparatus according to the invention might be incorporated in a software defined radio.

There are already proposals for future radios to be able to reconfigure their own hardware, under the control of embedded software, to handle different data formats and protocols. For example WO-A-99/09721 discloses a "self configuring multi-mode communications terminal". FIG. 11 illustrates how the present invention might be employed in such a radio.

The software defined architecture may be taken to exemplify the future of mobile radio transceivers, integrating DSP techniques and embedded software to the best advantage.

In FIG. 11, items 201,203 and 204 include the necessary set of protocol stacks (more than one is essential to any "software radio"). Likewise items 202, end user support, and 205, intelligent support, would be present in a software radio. More particularly, item204would include physical and data link reconfiguration resources as well as software required to adjust other reconfigurable hardware in the radio receiver or sender. Reconfiguration of hardware would include types and parameters of modulators, demodulators, filter bandwidths, speed and precision of ADC and DAC and the tuning of the r.f. channel itself. It might and may also include smart-antenna technology, variable up-link and down-link frequency separations, band spreading techniques such as frequency hopping and/or direct sequence (e.g. CDMA), adaptive power control, time-division duplexing, direction finding and other location-related services effected through the r.f. bearer.

Item 206 represents an additional item not present in current software radio proposals, namely means receiving EMC information, such as special band restrictions, local (country-specific) radio regulations, warnings of temporary radio interference. Looking even further ahead, means possibly might exist for negotiation, hence the two-way arrows.

A data interface 207 interfaces between reconfigurable hardware and the intelligent support. It is assumed to be handling data packets on both the down link (received off air), and on the up link (sent to the local base station). The reconfigurable hardware is proposed for software radios but in this example is separated into receiver hardware 208 and sender hardware 209.

ADC 210 and DAC 211 are present with the ADC in the receiver, and the DAC in the sender. In addition to whatever adjustments are already needed in a software radio (such as alteration of the clock rate, number of bits of resolution), the real-time changes of i.f. determined by the embedded software according to the invention may also play a part in deciding clock rates, bit-resolution, decimation, etc. Not shown but inferred is the possible doubling up on DAC and ADC devices respectively in order to furnish I and Q channels for advanced modulation and demodulation techniques. See also item 222 below.

Items 212 to 220 inclusive correspond to their symbolic counterparts in FIG. 1 and, together, constitute the receiving half of the "RF/IF" block. Items221 to 228 inc. make up the sender hardware, and constitute the sending half of the "RF/IF" block. Items 212 and 228 here show separate antennas for receiving and sending. In some architectures (frequently for mobile transceivers) a common antenna serves both receiver and sender by means of either a duplexer (for full duplex communication systems) or antenna changeover switch (for two-way simplex systems).

Item 221 could possibly be a synthesised local oscillator for conventional type modulators in item 222. In such case, the local oscillator would be tuned to the choice of i.f. selected by the method of the invention for the sender (up link). Alternatively, item 221 might be the generator of a clock waveform to run the DSP modulator, item 222.

The functions of items 212 to 228 are analogous to those shown in FIG. 1 and will not be described in detail herein.

Item 222: In more advanced, fully digital modulation schemes, the signal modulation may be generated by direct signal synthesis, replacing the need for item 211. The centre frequency of the resulting signal, corresponding to the sender's first i.f., would, in that case, be determined by DSP algorithms in combination with the frequency of a clock waveform, see item 221.

What is claimed is:

1. A computer program product comprising a computer readable medium having thereon computer program code means, when said program is loaded, to make the computer execute, when supplied with at least tuning band and avoidance band data, a method of determining an appropriate intermediate frequency or intermediate frequency range for a radio frequency (r.f.) receiver in which a received modulated r.f. signal is mixed with a signal from a local oscillator at a different frequency to yield as one of the mixing products a signal at a desired intermediate frequency for subsequent processing, the method comprising the steps of:

a) determining a tuning band of radio frequencies which the receiver is desired to receive;

b) determining an avoidance band containing radio frequencies closed to external transmission and/or frequencies of sources of outside interference;

c) identifying a plurality of spurious mechanisms by which the receiver either receives or transmits spurious signals and determining the frequencies of the spurious signals in relation to the intermediate frequency; and d) determining which intermediate frequencies result in spurious emissions to or responses from the avoidance band for any of the frequencies in the tuning band.

2. A computer program product as claimed in claim 1 in which step (d) includes determining, for each spurious mechanism, one or more hazard bands, being ranges of frequency of spurious emissions or responses each corresponding to the whole of the tuning band.

3. A computer program product as claimed in claim 1 in which the spurious mechanisms include one of the second images.

4. A computer program product as claimed in claim 1 in which the spurious mechanisms include both of the second images.

5. A computer program product as claimed in claim 1 in which the spurious mechanisms include one of the third images.

6. A computer program product as claimed in claim 1 in which the spurious mechanisms include both of the third images.

7. A computer program product as claimed in claim 1 in which the spurious mechanisms include the mixer sum product.

8. A computer program product as claimed in claim 1 including the step of determining one or more additional avoidance bands and repeating step (d) for each additional avoidance band.

9. A computer program product as claimed in claim 1 in which the spurious mechanisms are ranked according to their significance and in which a range of available intermediate frequencies is divided in to sub-ranges each identified by the most significant spurious mechanism, if any, affecting the avoidance band(s) and resulting from the use of an intermediate frequency in that sub-range.

10. A computer program product as claimed in claim 1 in which the spurious mechanisms include the first image.

11. A computer program product as claimed in claim 1 in which the spurious mechanisms include local oscillator leakage.

12. A computer program product as claimed in claim 1 in which the spurious mechanisms include intermediate frequency leakage.

13. A computer program product as claimed in claim 1 in which the spurious mechanisms include the second harmonic of the local oscillator.

14. A computer program product as claimed in claim 1 in which the spurious mechanisms include the third-order reverse inter-modulation product of the local oscillator and any external source of interference in the tuning band.

15. A computer program product comprising a computer readable medium having thereon computer program code means, when said program is loaded, to make the computer execute, when supplied with at least tuning band and avoidance band data, a method of determining an appropriate intermediate frequency or intermediate frequency range for a radio frequency transmitter in which a modulated signal at an intermediate frequency is mixed with a local oscillator waveform having a different frequency to yield as one of the mixing products a signal at a desired frequency for transmission, the method comprising:

a) determining a tuning band of frequencies which the transmitter is desired to transmit;

b) determining an avoidance band containing radio frequencies closed external transmission;

c) identifying a plurality of spurious mechanisms by which the transmitter transmits spurious signals and determining the relationship between the spurious signals and the intermediate frequency; and d) determining which intermediate frequencies result in spurious emissions to the avoidance band for any of the frequencies in the tuning range.

16. A computer program product as claimed in claim 15 in which step (d) includes determining, for each spurious mechanism, one or more hazard bands being ranges of frequency of spurious emissions each corresponding to the whole of the tuned band.

17. A computer program product as claimed in claim 15 including the step of determining one or more additional avoidance bands and repeating step (d) for each additional avoidance band.

18. A computer program product as claimed in claim 15 in which the spurious mechanisms are ranked according to their significance and in which a range of available intermediate frequencies is divided in to sub-ranges each identified by the most significant spurious mechanism, if any, affecting the avoidance band(s) and resulting from the use of an intermediate frequency in that sub-range.

19. A computer program product as claimed in claim 15 in which the spurious mechanisms include the first image.

20. A computer program product as claimed in claim 15 in which the spurious mechanisms include local oscillator leakage.

21. A computer program product as claimed in claim 15 in which the spurious mechanisms include intermediate frequency leakage.

22. A computer program product as claimed in claim 15 in which the spurious mechanisms include the second harmonic of the local oscillator.

23. A computer program product as claimed in claim 15 in which the spurious mechanisms include the third-order reverse inter-modulation product of the local oscillator and any external source of interference in the tuning band.

24. Apparatus for determining an appropriate intermediate frequency or intermediate frequency range for a radio frequency (r.f.) receiver in which a received modulated r.f. signal is mixed with a signal from a local oscillator at a different frequency to yield as one of the mixing products a signal at a desired intermediate frequency for subsequent processing, the apparatus comprising:

a) means for receiving input data defining a tuning band of radio frequencies which the receiver is desired to receive;

b) means for receiving input data defining an avoidance band containing radio frequencies closed to external transmission and/or frequencies of sources of outside interference;

c) means for storing data relating to a plurality of spurious mechanisms by which the receiver either receives or transmits spurious signals and determining the frequencies of the spurious signals in relation to the intermediate frequency;

d) means for determining which intermediate frequencies result in spurious emissions to or responses from the avoidance band for any of the frequencies of the tuning band.

25. Apparatus as claimed in claim 24 in which said means (d) includes means for determining, for each spurious mechanism, one or more hazard bands, being ranges of frequency of spurious emissions or responses each corresponding to the whole of the tuning band.

26. Apparatus as claimed in claim 24 in which the spurious mechanisms include one of the second images.

27. Apparatus as claimed in claim 24 in which the spurious mechanisms include both of the second images.

28. Apparatus as claimed in any of claim 24 in which the spurious mechanisms include one of the third images.

29. Apparatus as claimed in claim 24 in which the spurious mechanisms include both of the third images.

30. Apparatus as claimed in claim 24 in which the spurious mechanisms include the mixer sum product.

31. Apparatus as claimed in claim 24 in which the spurious mechanisms are ranked in said means (c) according to their significance and in which a range of available intermediate frequencies is divided in to sub-ranges each identified by the most significant spurious mechanism, if any, affecting the avoidance band(s) and resulting from the use of an intermediate frequency in that sub-range.

32. Apparatus as claimed in claim 31 in which said means (c) stores ranking data for the spurious mechanisms.

33. Apparatus as claimed in claim 31 including means for receiving input data relating to the ranking of the spurious mechanisms.

34. Apparatus as claimed in claim 24 in which the spurious mechanisms include the first image.

35. Apparatus as claimed in claim 24 in which the spurious mechanisms include local oscillator leakage.

36. Apparatus as claimed in claim 24 in which the spurious mechanisms include intermediate frequency leakage.

37. Apparatus as claimed in claim 24 in which the spurious mechanisms include the second harmonic of the local oscillator.

38. Apparatus as claimed in claim 24 in which the spurious mechanisms include the third-order reverse intermodulation product of the local oscillator and any external source of interference in the tuning band.

39. Apparatus as claimed in claim 24 including selection means for selecting a plurality of spurious mechanisms from a larger plurality of spurious mechanisms in said storing means (c) and inputting only said selection to said determining means.

40. A radio frequency receiver having means for receiving modulated r.f. signals, a mixer and a local oscillator, in which said mixer mixes said r.f, signals with signals from said local oscillator to yield as one of the mixing products a signal at a desired intermediate frequency or a range of signals at a range of intermediate frequency for subsequent processing, said receiver further having apparatus according to claim 24
and means for changing the intermediate frequency or intermediate frequency range in response to said determining means to a frequency or range which minimises spurious responses from or emissions to the avoidance band(s) for the whole of the tuning range.

41. A receiver as claimed in claim 40 having means for receiving transmitted information relating to avoidance bands and supplying said information to said means (b).

42. A receiver as claimed in claim 40 having means storing information relating to avoidance bands and geographical location and means for receiving geographical location information to determine the appropriate avoidance band(s).

43. A receiver as claimed in claim 40 having means for receiving transmitted geographical information.

44. A receiver as claimed in claim 40 in which said determining means comprises a microprocessor.

45. A receiver as claimed in claim 40 in which said means for changing the intermediate frequency or frequency range operates to change the frequency of the local oscillator.

46. A receiver as claimed in claim 40 including band pass filter means for receiving the mixer output and selecting signals at the intermediate frequency or range, in which the pass band of said filter means is variable depending on the intermediate frequency.

47. A receiver as claimed in claim 46 in which the filter means comprises a plurality of band pass filters having different pass bands and switching means connecting a selected one of said band pass filters to the output of the mixer.

48. Apparatus as claimed in claim 40 including tunable filter means for receiving the mixer output and selecting signals at precise intermediate frequency.

49. Apparatus as claimed in claim 48 in which said tunable filter means comprises a plurality of tunable filters having different tuning bands encompassing a contiguous range of intermediate frequencies.

50. A radio frequency transceiver including a receiver as claimed in claim 40 and a transmitter, the transmitter including a mixer having an input connected to a local oscillator for mixing signals for transmission with a local oscillator waveform having a different frequency to yield as one of the mixing products a signal at a desired frequency for transmission, wherein said apparatus for determining an intermediate frequency (i.f.) or i.f. range for the receiver is also operable to determine an i.f. or i.f. range for the transmitter and wherein the transmitter has means for changing the intermediate frequency in response to said determining means to an i.f. or i.f. range which minimises spurious emissions to the avoidance band(s) for the whole of the tuning range.

51. A transceiver as claimed in claim 50 in which the means for changing the transmitter i.f. operates to change the frequency of the transmitter local oscillator frequency.

52. Apparatus for determining an appropriate intermediate frequency for a radio frequency transmitter in which a modulated signal at an intermediate frequency is mixed with a local oscillator waveform having a different frequency to yield as one of the mixing products a signal at a desired frequency for transmission, the apparatus comprising:
  a) means for receiving input data defining a tuning band of frequencies which the transmitter is desired to transmit;
  b) means for receiving input data defining an avoidance band containing radio frequencies closed to external transmission;
  c) means for storing data relating to a plurality of spurious mechanisms by which the transmitter transmits spurious signals and determining the relationship between the spurious signals and the intermediate frequency; and
  d) means for determining which of the intermediate frequencies result in spurious emissions to the avoidance band for any of the frequencies in the tuning band.

53. Apparatus as claimed in claim 52 in which said means include means for determining, for each spurious mechanism, one or more hazard bands being ranges of frequency of spurious emissions each corresponding to the whole of the tuned band.

54. Apparatus as claimed in claim 52 in which the spurious mechanisms are ranked in said means (c) according to their significance and in which a range of available intermediate frequencies is divided in to sub-ranges each identified by the most significant spurious mechanism, if any, affecting the avoidance band(s) and resulting from the use of an intermediate frequency in that sub-range.

55. Apparatus as claimed in claim 52 in which the spurious mechanisms include the first image.

56. Apparatus as claimed in claim 52 in which the spurious mechanisms include local oscillator leakage.

57. Apparatus as claimed in claim 52 in which the spurious mechanisms include intermediate frequency leakage.

58. Apparatus as claimed in claim 52 in which the spurious mechanisms include the second harmonic of the local oscillator.

59. Apparatus as claimed in claim 52 in which the spurious mechanisms include the third-order reverse intermodulation product of the local oscillator and any external source of interference in the tuning band.

60. Apparatus as claimed in claim 52 including selection means for selecting a plurality of spurious mechanisms from a larger plurality of spurious mechanisms in said storing means (c) and inputting only said selection to said determining means.

* * * * *